(12) United States Patent
Kondo et al.

(10) Patent No.: US 10,342,138 B2
(45) Date of Patent: Jul. 2, 2019

(54) CHIP PART AND MANUFACTURING METHOD THEREOF

(71) Applicant: ROHM CO., LTD., Kyoto (JP)

(72) Inventors: Yasuhiro Kondo, Kyoto (JP); Katsuya Matsuura, Kyoto (JP); Hiroshi Tamagawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 28 days.

(21) Appl. No.: 15/670,627

(22) Filed: Aug. 7, 2017

(65) Prior Publication Data

US 2018/0042118 A1 Feb. 8, 2018

(30) Foreign Application Priority Data

Aug. 8, 2016 (JP) .................. 2016-155914

(51) Int. Cl.
| | |
|---|---|
| H01L 23/31 | (2006.01) |
| H05K 3/00 | (2006.01) |
| H01L 21/71 | (2006.01) |
| H01L 21/78 | (2006.01) |
| H05K 3/04 | (2006.01) |
| B23K 1/005 | (2006.01) |
| H05K 13/02 | (2006.01) |
| H01L 23/66 | (2006.01) |
| H01L 23/00 | (2006.01) |
| H01L 21/683 | (2006.01) |

(Continued)

(52) U.S. Cl.
CPC ........... *H05K 3/045* (2013.01); *B23K 1/0056* (2013.01); *H01L 21/6836* (2013.01); *H01L 21/71* (2013.01); *H01L 21/78* (2013.01); *H01L 23/3185* (2013.01); *H01L 23/3192* (2013.01); *H01L 23/564* (2013.01); *H01L 23/66* (2013.01); *H01L 24/03* (2013.01); *H05K 3/002* (2013.01); *H05K 3/0044* (2013.01); *H05K 13/024* (2013.01); *H01L 22/12* (2013.01); *H01L 24/05* (2013.01); *H01L 2221/68327* (2013.01); *H01L 2224/0348* (2013.01); *H01L 2224/03462* (2013.01); *H01L 2224/0401* (2013.01); *H01L 2224/05164* (2013.01); *H01L 2224/05572* (2013.01); *H01L 2224/05582* (2013.01); *H01L 2224/05644* (2013.01); *H01L 2224/131* (2013.01); *H01L 2224/16238* (2013.01); *H01L 2224/94* (2013.01); *H01L 2924/10158* (2013.01); *H05K 1/0274* (2013.01)

(58) Field of Classification Search
CPC ..... H01L 21/71; H01L 33/483; H05K 1/0274; H05K 3/045; H05K 2201/10568
See application file for complete search history.

(56) References Cited

U.S. PATENT DOCUMENTS 6,261,919 B1 * 7/2001 Omizo .................. H01L 23/544
257/E23.179

FOREIGN PATENT DOCUMENTS

JP 2005-197530 A 7/2005

* cited by examiner

*Primary Examiner* — Daniel P Shook
(74) *Attorney, Agent, or Firm* — Rabin & Berdo, P.C.

(57) ABSTRACT

A chip part includes a substrate having a first main surface on one side thereof and a second main surface on the other side thereof, a functional device famed at a first main surface side of the substrate, an external terminal formed at the first main surface side of the substrate and electrically connected to the functional device, and a light diffusion reflection structure formed at a second main surface side of the substrate and diffusely reflecting light irradiated toward the second main surface of the substrate.

6 Claims, 26 Drawing Sheets

(51) Int. Cl.
*H05K 1/02* (2006.01)
*H01L 21/66* (2006.01)

41 42 41

1 43 1

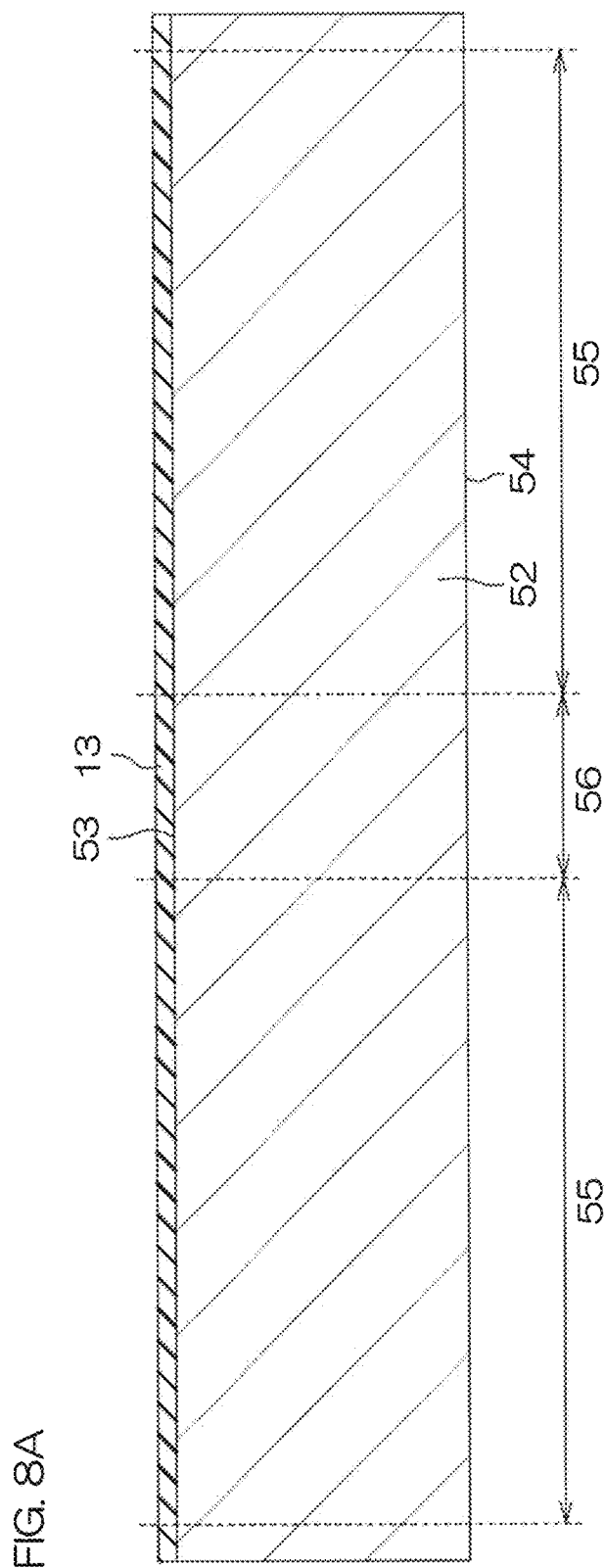

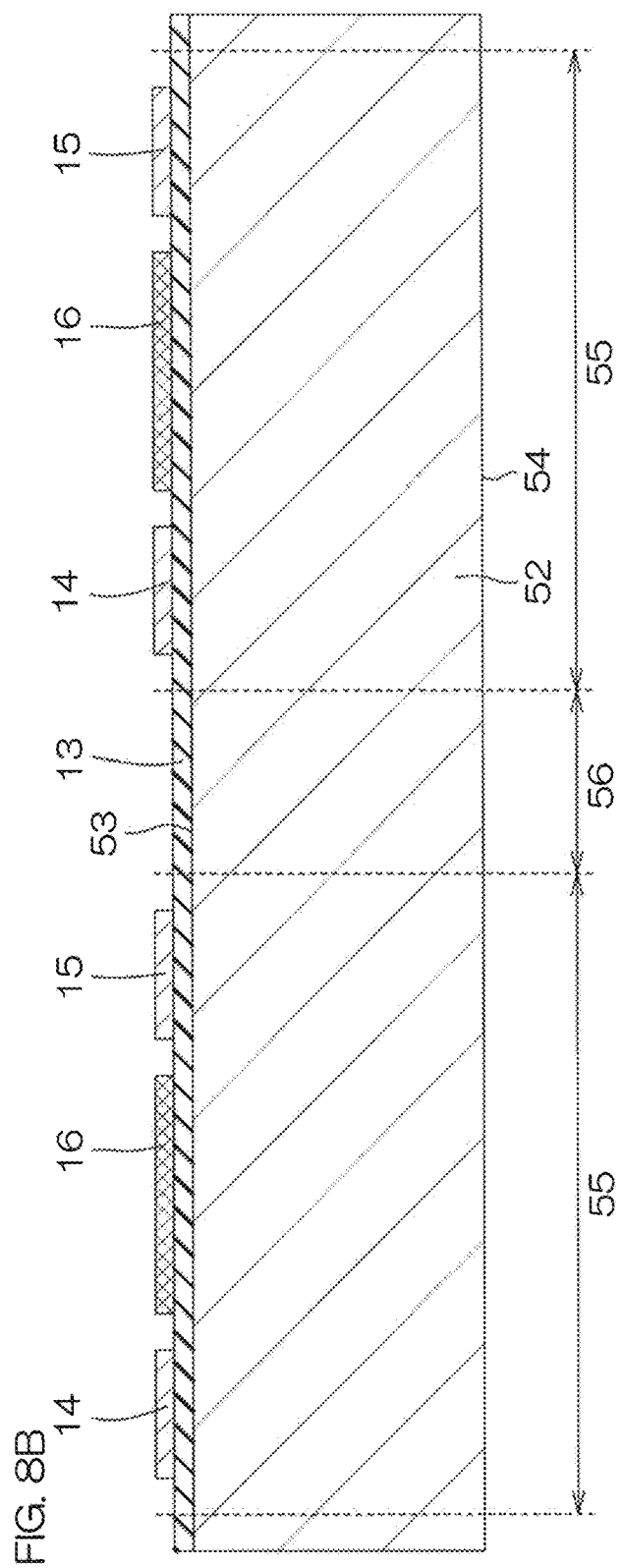

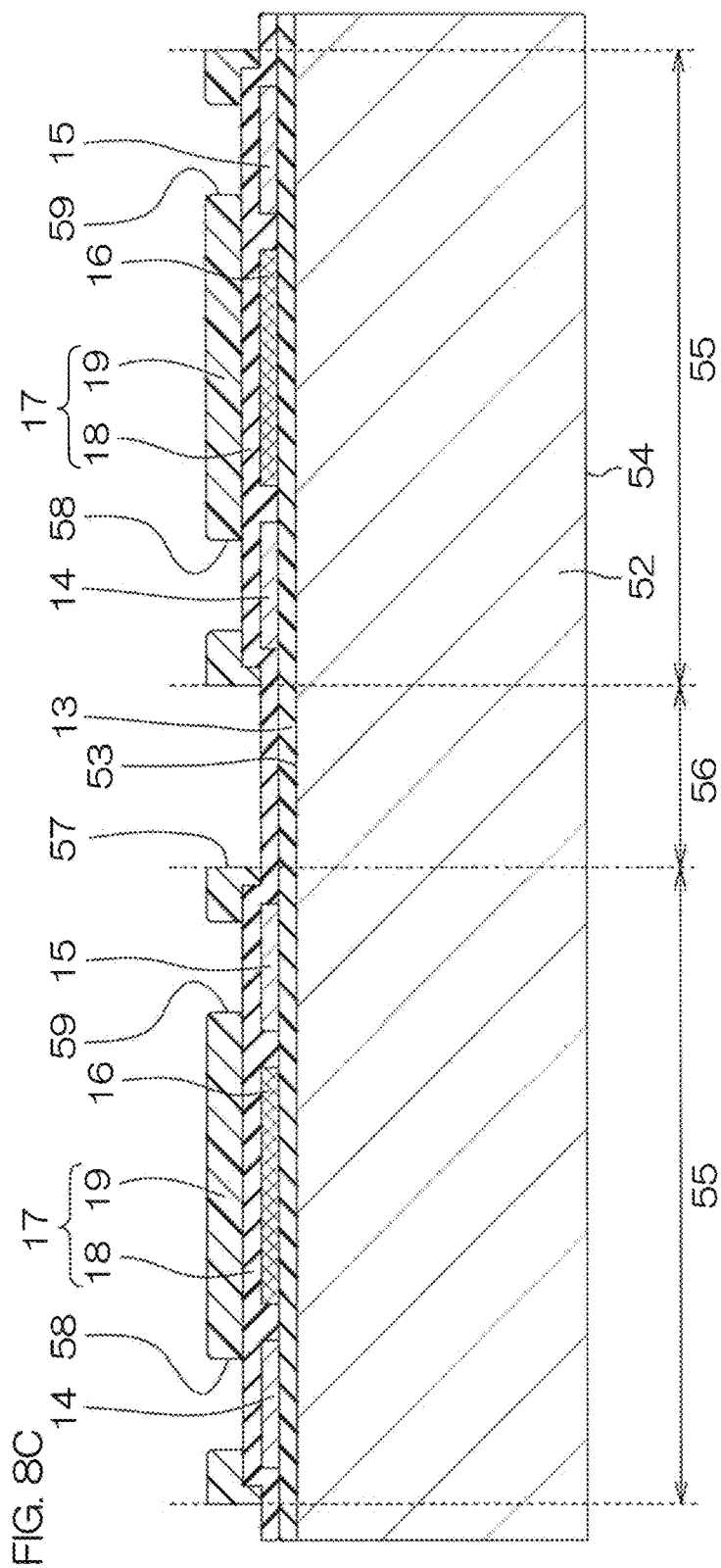

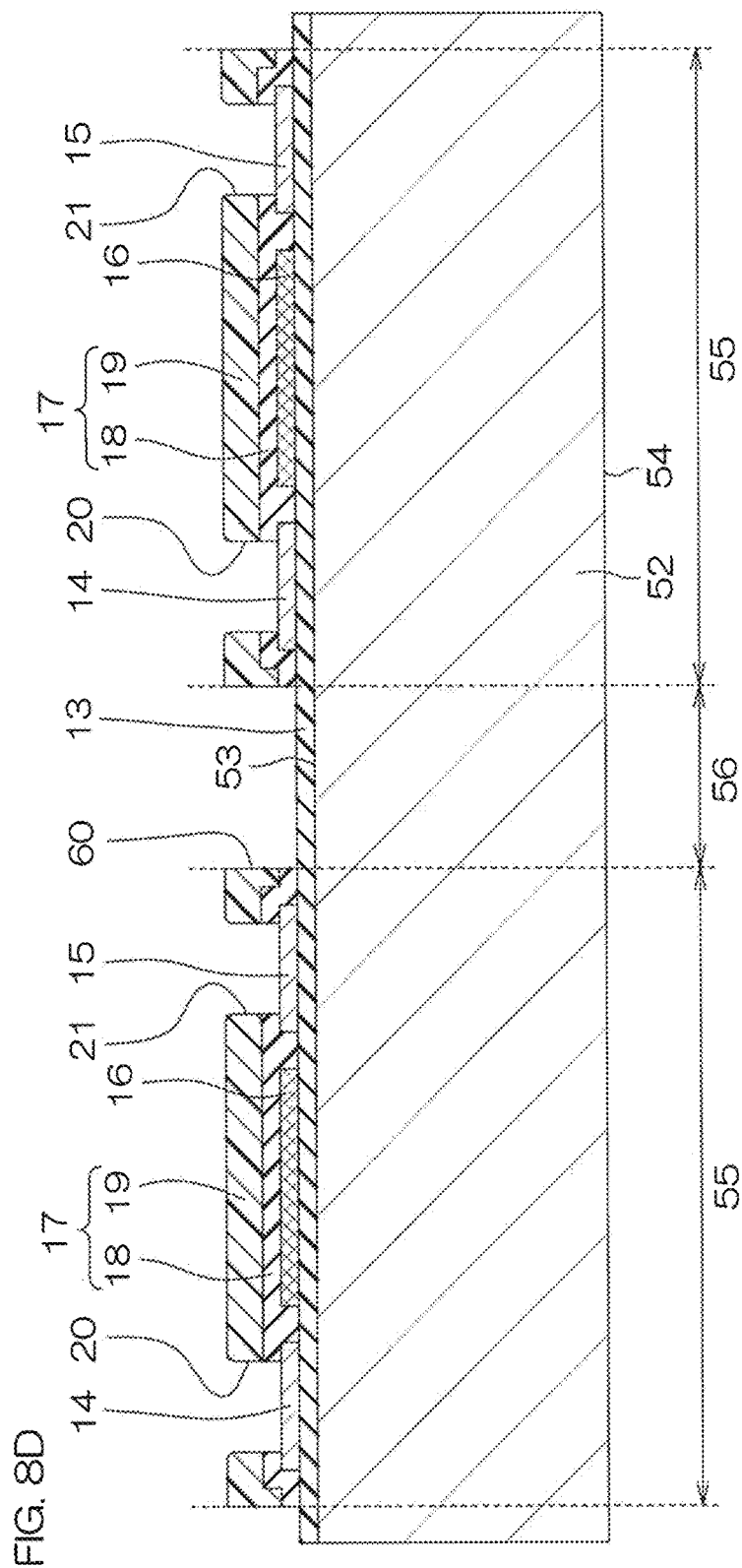

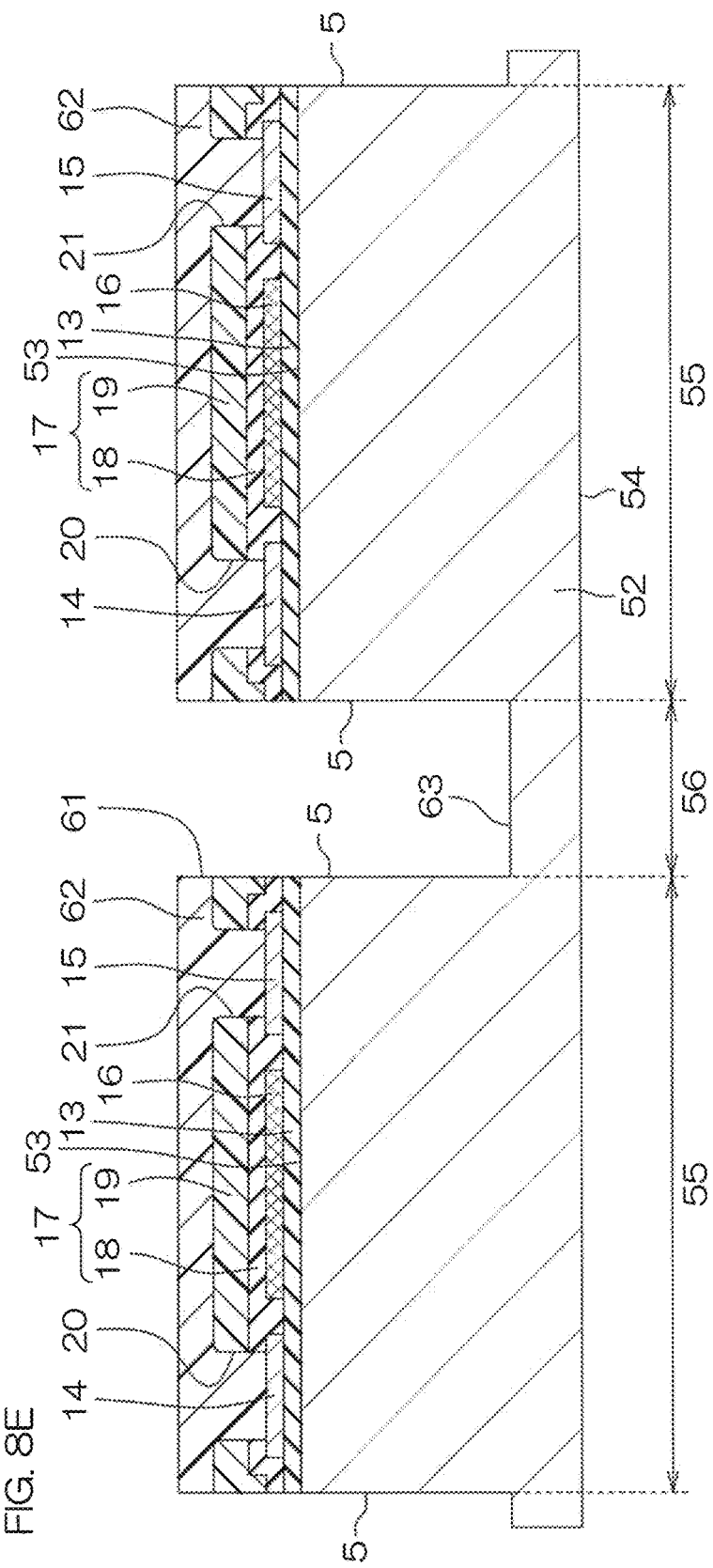

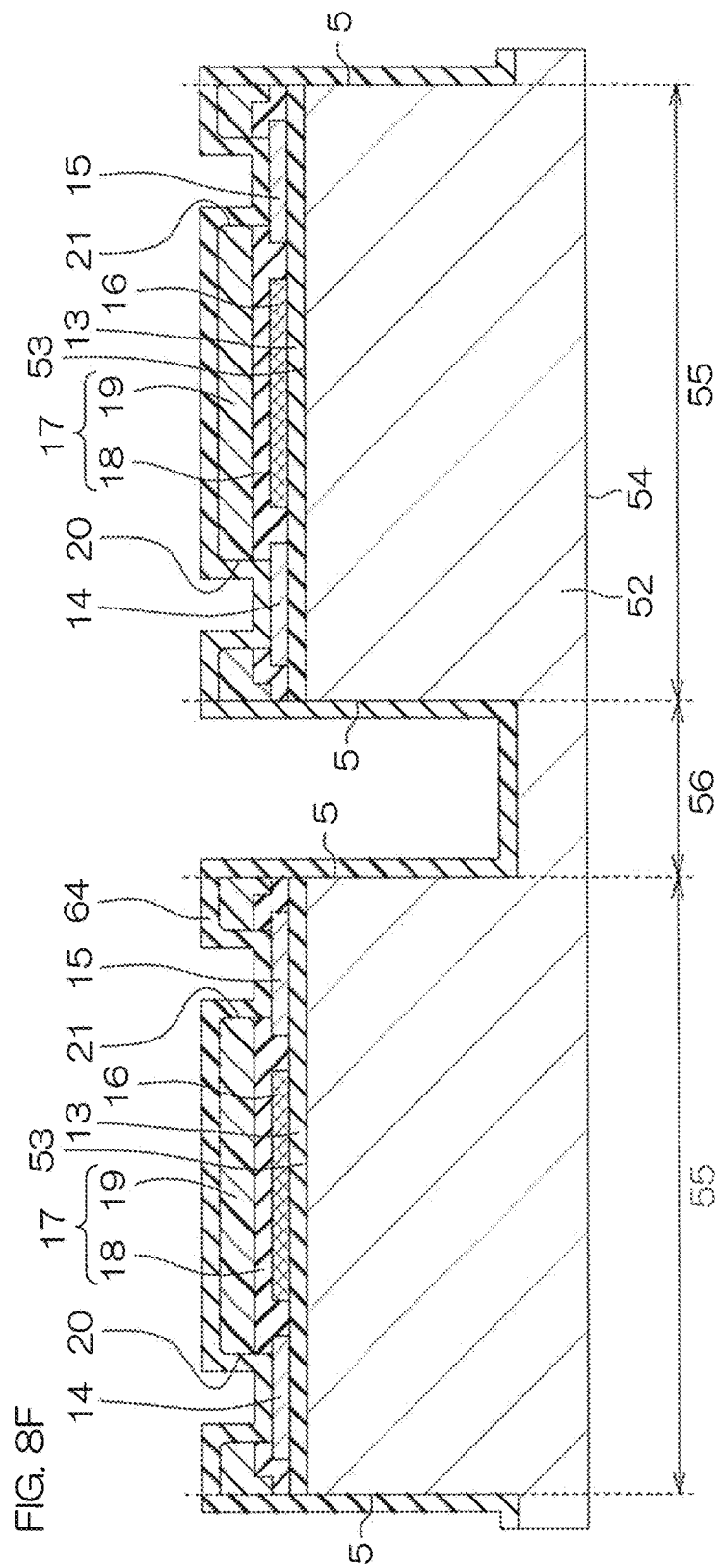

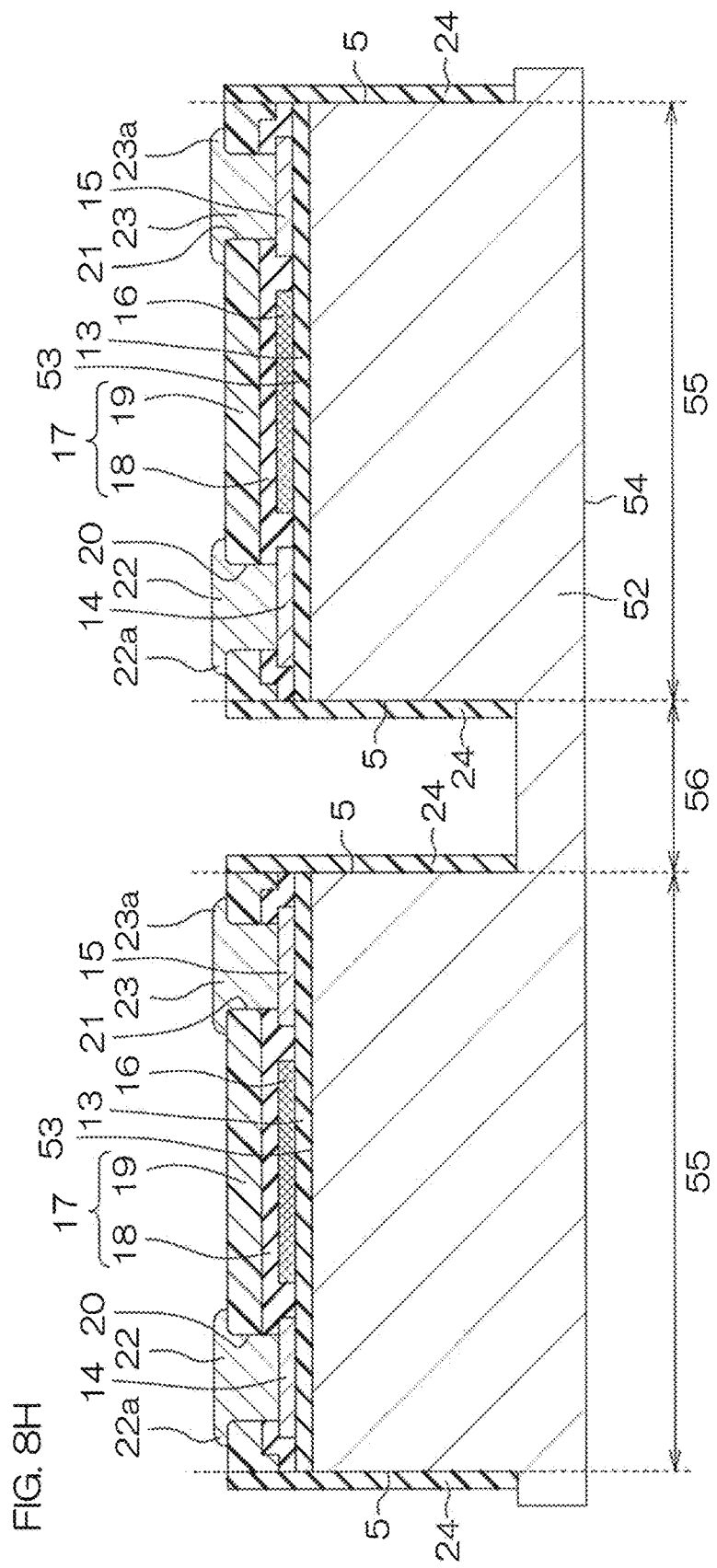

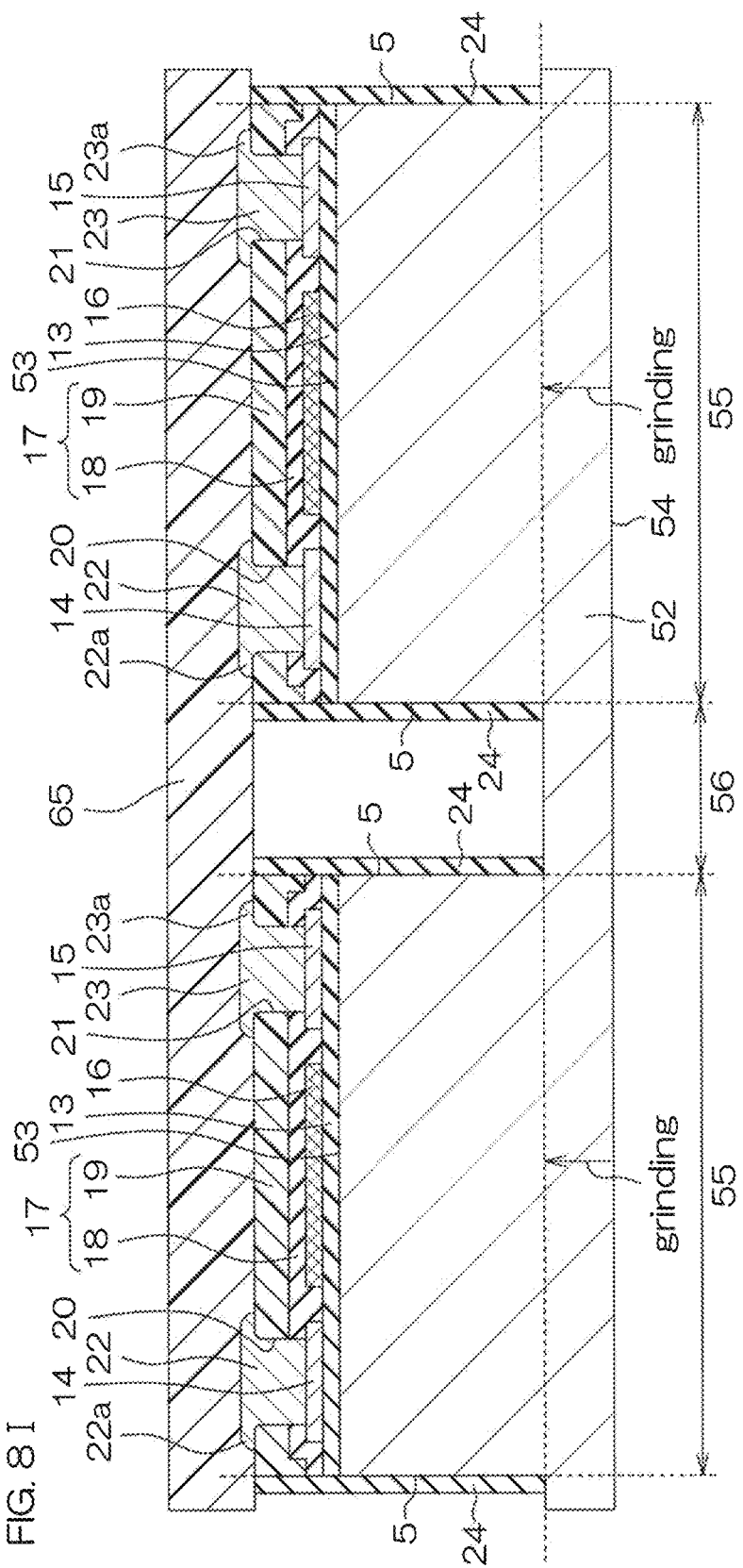

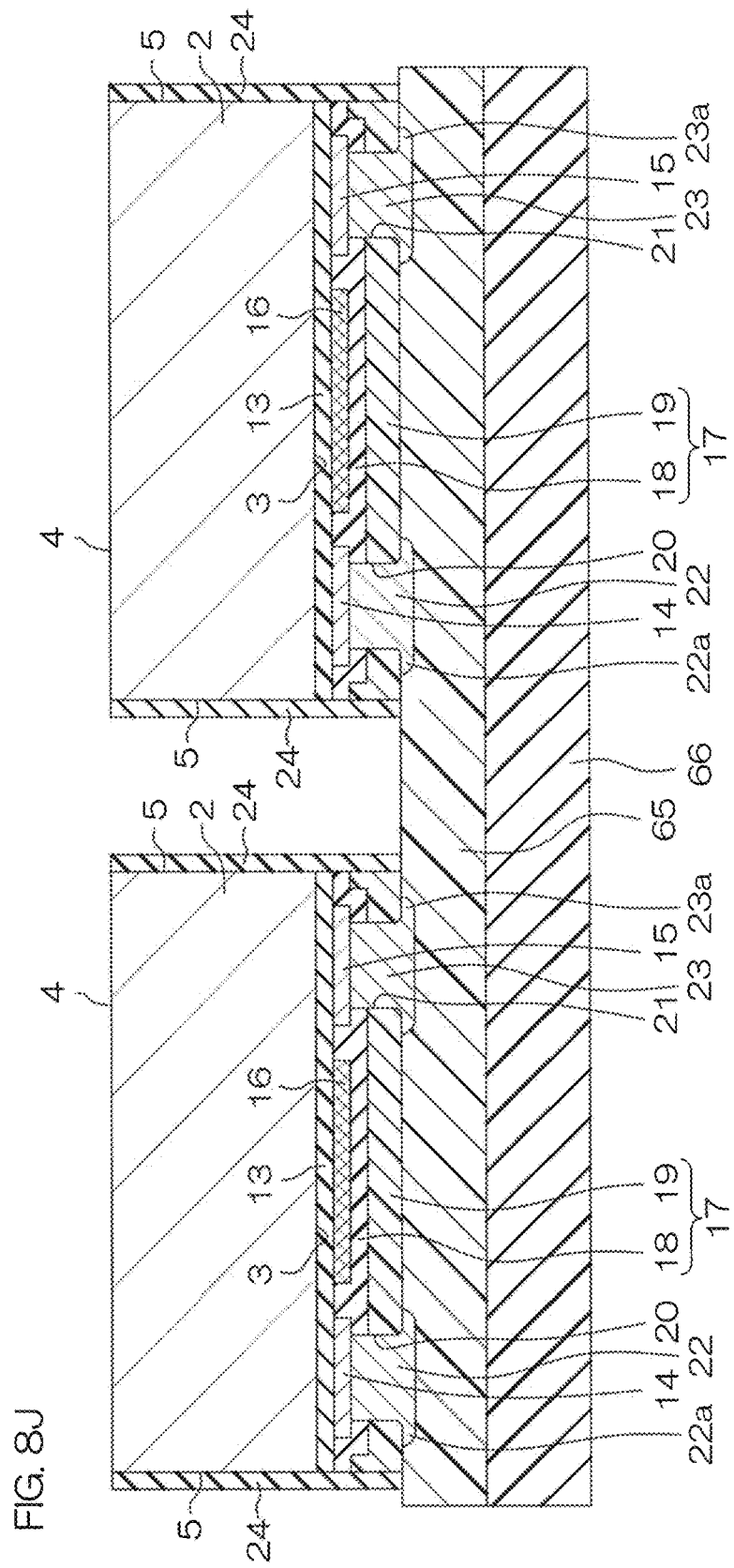

CHIP PART AND MANUFACTURING METHOD THEREOF

BACKGROUND OF THE INVENTION

1. Field of the Invention

The present invention relates to a chip part and a manufacturing method thereof.

2. Description of the Related Art

JP 2005-197530 discloses a multilayer ceramic electronic component as an example of a chip part.

SUMMARY OF THE INVENTION

One preferred embodiment of the present invention provides a chip part including a substrate having a first main surface on one side thereof and a second main surface on the other side thereof, a functional device famed at a first main surface side of the substrate, an external terminal formed at the first main surface side of the substrate and electrically connected to the functional device, and a light diffusion reflection structure formed at a second main surface side of the substrate and diffusely reflecting light irradiated toward the second main surface of the substrate.

One preferred embodiment of the present invention provides manufacturing method of a chip part including a step of preparing a substrate including a first main surface on one side thereof and a second main surface on the other side thereof and having a functional device formed at a first main surface side thereof, and a step of roughening the second main surface of the substrate.

The above-described objects, features, and the advantages and/or other objects, features, and the advantages according to the present invention will be made apparent from the following description of preferred embodiments taken in conjunction with the accompanying drawings.

BRIEF DESCRIPTION OF THE DRAWINGS

FIG. 8A to FIG. 8K are cross sectional views for explaining a manufacturing method of the chip part shown in FIG. 1.

BRIEF DESCRIPTION OF THE DRAWINGS

Figure 1:
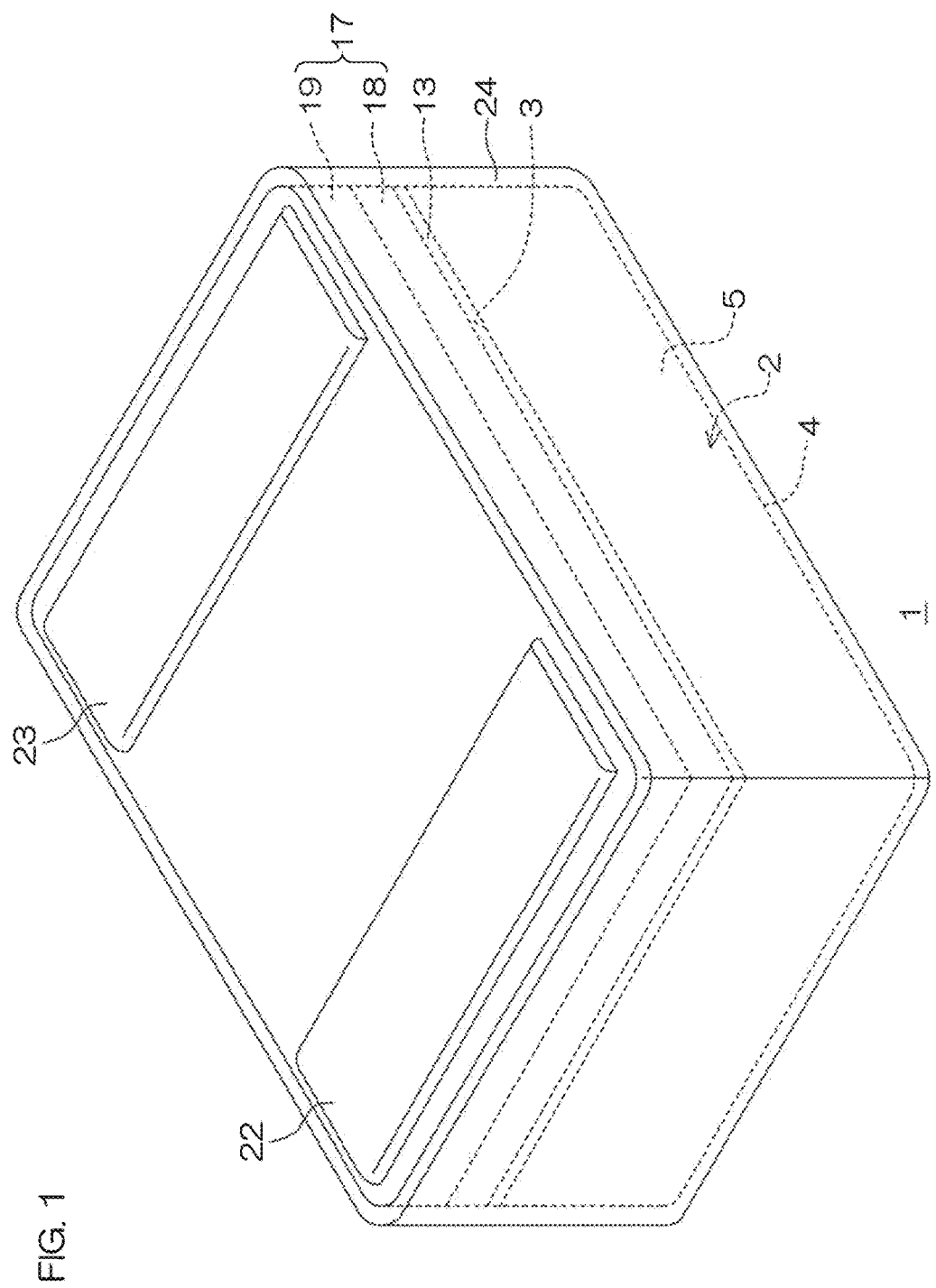
FIG. 1 is a perspective view of a chip part according to one preferred embodiment of the present invention.

A chip part, a circuit module having a mounting substrate whereon a chip part is mounted, and so on are to be inspection targets in an external appearance inspection. The external appearance inspection can be performed by an electronic microscope having an imaging device and a light source. The chip part is imaged by the imaging device in a state where the light is irradiated from the light source.

The image of the chip part obtained through the external appearance inspection is compared with a reference image for a quality determination that shows, for example, a chip part being "normality". In a case where color, tint, and so on of the chip part in the obtained image are different from those of the chip part in the reference image, the condition of the chip part in the obtained image is judged as "abnormality".

However, in a case where the chip part has a mirrored outer surface, a bias in a light reflection direction may occur depending on an arrangement position of the chip part with respect to the light source. For example, a chip part that reflects most of the irradiated light towards the imaging device may exist, while a chip part that reflects most of the irradiated light towards outside the imaging device may exist.

In a case where the bias exists in the light reflection direction reflected by the chip part, despite the condition of the chip part is "normality", a variation in the color, tint, and so on of each chip part in the obtained image can be occurred. Therefore, the quality determination for the chip part can not be performed smoothly.

The preferred embodiment of the present invention thus provides a chip part capable of contributing a smooth external appearance inspection and a manufacturing method thereof.

One preferred embodiment of the present invention provides a chip part including a substrate having a first main surface on one side thereof and a second main surface on the other side thereof, a functional device famed at a first main surface side of the substrate, an external terminal formed at the first main surface side of the substrate and electrically connected to the functional device, and a light diffusion reflection structure formed at a second main surface side of the substrate and diffusely reflecting light irradiated toward the second main surface of the substrate.

According to the chip part, the light irradiated toward the second main surface of the substrate can be diffusely reflected by the light diffusion reflection structure. A bias in the light reflection direction due to the arrangement position of the chip part with respect to the light source can thus be suppressed, in a case where the external appearance inspection is performed.

The occurrence of variations in color, tint and so on of the chip part due to the arrangement position of the chip part with respect to the light source can thus be suppressed, in an image obtained through the external appearance inspection. As a result, the chip part where visual color change is small in the image obtained through the external appearance inspection can be judged as being "normality". On the other hand, the chip part where visual color change is large in the image obtained through the external appearance inspection can be judged as being "abnormality". The chip part capable of contributing a smooth external appearance inspection can thereby be provided.

Various forms can be adopted as the functional device formed at the first main surface side of the substrate. For example, the functional device includes a functional device formed by using a surficial portion of the first main surface of the substrate, a functional device formed by using the first main surface of the substrate, and/or, a functional device formed by using a region above the first main surface of the substrate.

One preferred embodiment of the present invention provides manufacturing method of a chip part including a step of preparing a substrate including a first main surface on one side thereof and a second main surface on the other side thereof and having a functional device formed at a first main surface side thereof, and a step of roughening the second main surface of the substrate.

According to the manufacturing method of the chip part, a chip part having a structure where the light diffusion reflection structure is formed at the second main surface of the substrate is manufactured. A bias in the light reflection direction due to the arrangement position of the chip part with respect to the light source can thus be suppressed, in a case where the external appearance inspection is performed with respect to the chip part.

The occurrence of variations in color, tint, and so on of the chip part due to the arrangement position of the chip part with respect to the light source can thus be suppressed, in an image obtained through the external appearance inspection. As a result, the chip part where visual color change is small in the image obtained through the external appearance inspection can be judged as being "normality". On the other hand, the chip part where visual color change is large in the image obtained through the external appearance inspection can be judged as being "abnormality". The chip part capable of contributing a smooth external appearance inspection can thereby be manufactured and provided.

Various forms can be adopted as the functional device formed on the first main surface side of the substrate. For example, the functional device includes a functional device formed by using a surficial portion of the first main surface of the substrate, a functional device formed by using the first main surface of the substrate, and/or, a functional device formed by using a region above the first main surface of the substrate.

Hereinafter, a preferred embodiment according to the present invention is described in detail with reference to the accompanying drawings.

Figure 2:
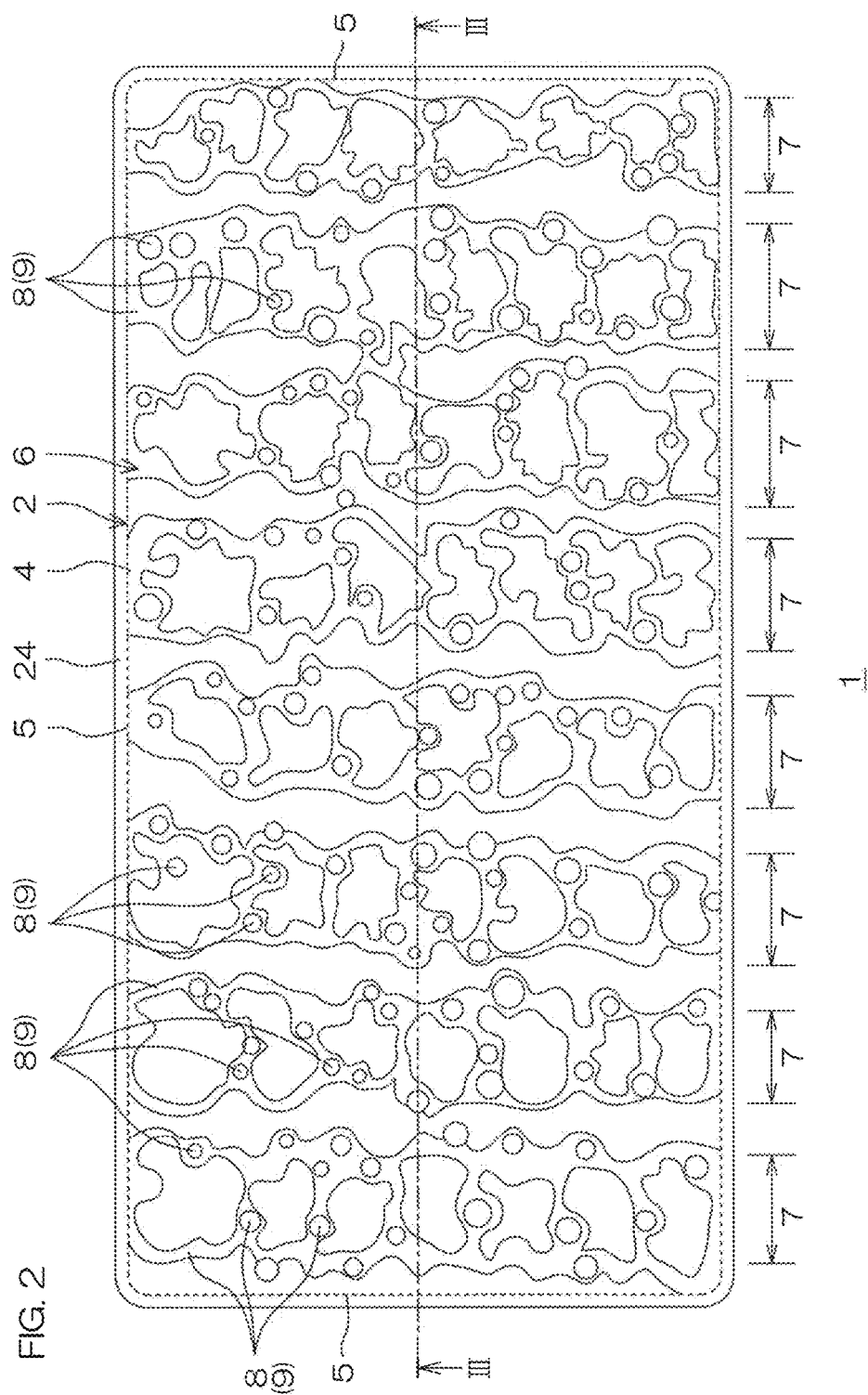
FIG. 2 is a bottom view of the chip part shown in FIG. 1.
Figure 3:
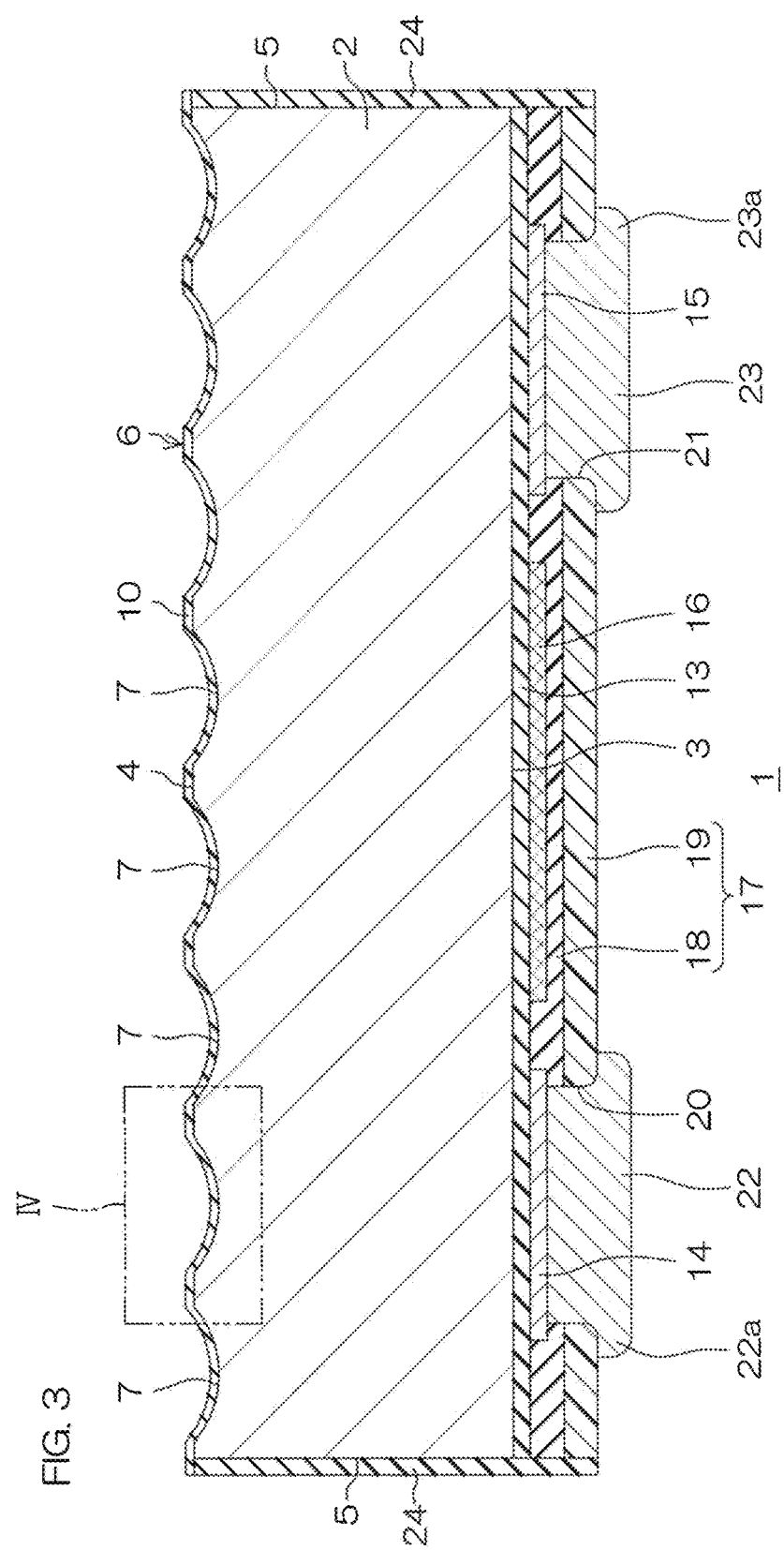
FIG. 3 is a cross sectional view taken along line shown in FIG. 2.
Figure 4:
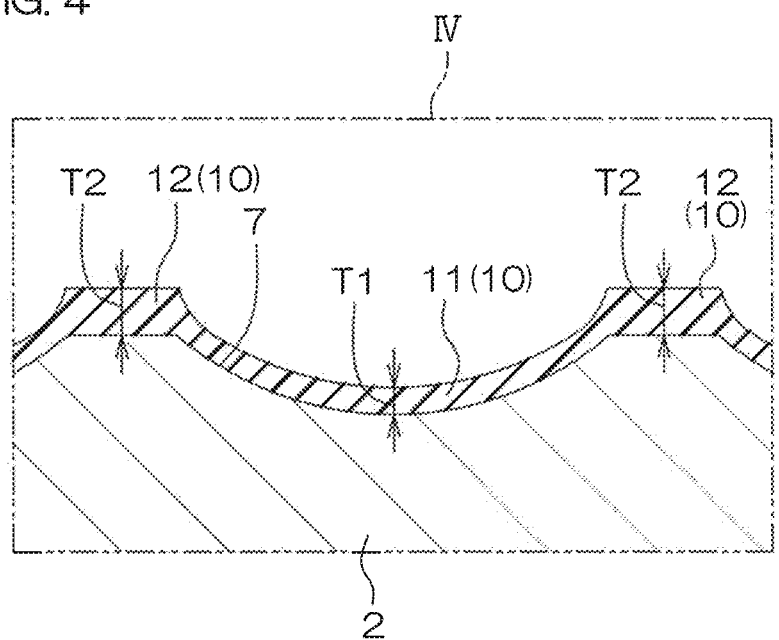
FIG. 4 is an enlarged view of a region IV shown in FIG. 3.

FIG. 1 is a perspective view of a chip part 1 according to one preferred embodiment of the present invention. FIG. 2 is a bottom view of the chip part 1 shown in FIG. 1. FIG. 3 is a cross sectional view taken along line shown in FIG. 2. FIG. 4 is an enlarged view of a region IV shown in FIG. 3.

The chip part 1 is a minute electronic component called a 0603 (0.6 mm×0.3 mm) chip, a 0402 (0.4 mm×0.2 mm) chip, a 03015 (0.3 mm×0.15 mm).

Referring to FIG. 1, the chip part 1 includes a substrate 2 having a substantially rectangular parallelepiped shape. The substrate 2 has a first main surface 3, a second main surface 4 located on the opposite side of the first main surface 3, and a sidewall 5 connecting the first main surface 3 and the second main surface 4. The first main surface 3 and the second main surface 4 of the substrate 2 are formed in a rectangular shape in a planar view as viewed from normal directions thereof (hereinafter simply referred to as "planar view").

Referring to FIG. 2, a light diffusion reflection structure 6 by which the light irradiated toward the second main surface 4 is diffusely reflected is formed at a second main surface 4 side of the substrate 2.

The light diffusion reflection structure 6 is formed by an uneven structure formed in the second main surface 4 of the substrate 2, more specifically. The uneven structure includes a plurality of recesses 7 recessed towards the first main surface 3. The second main surface 4 of the substrate 2 is roughened by the plurality of recesses 7. That is, the light diffusion reflection structure 6 is formed by a roughened surface formed in the second main surface 4 of the substrate 2, in the present preferred embodiment.

An etching method, a laser light irradiation method, a sand blasting method or the like can be exemplified as a method of roughening the second main surface 4 of the substrate 2 by the plurality of recesses 7.

In the case of the etching method, a part of the second main surface 4 of the substrate 2 is selectively removed by etching. The plurality of recesses 7 are thereby formed in the second main surface 4 of the substrate 2.

In the case of the laser light irradiation method, a part of the second main surface 4 of the substrate 2 is melted by laser light irradiation. The plurality of recesses 7 are thereby formed in the second main surface 4 of the substrate 2.

In the case of the sand blasting method, abrasives are blown to the second main surface 4 of the substrate 2. The plurality of recesses 7 are thereby formed in the second main surface 4 of the substrate 2.

An irregularity of the shape of the plurality of recesses 7 increases in this order of the etching method, the laser light irradiation method, and the sand blasting method. The laser light irradiation method is adopted as the roughening method in the present preferred embodiment. In FIG. 2, a mode where the plurality of recesses 7 is a laser processing trace formed by the laser light irradiation is shown.

The plurality of recesses 7 is formed at intervals along a first direction, in the present preferred embodiment. Each of the recesses 7 is formed in a belt-shape extending along a second direction orthogonal to the first direction. The first direction is a longitudinal direction of the substrate 2. The second direction is a transverse direction of the substrate 2. An uneven pattern having a stripe pattern is formed by the plurality of recesses 7 in the second main surface 4 of the substrate 2.

The plurality of recesses 7 may be formed at intervals along the second direction. In this case, the plurality of recesses 7 may be formed in a belt-shape extending along the first direction. The plurality of recesses 7 may have a regular dot pattern or an irregular dot pattern.

A plurality of protrusions 8 is formed in an inside region and an outside region of the plurality of recesses 7, in the second main surface 4 of the substrate 2. The plurality of protrusions 8 is foamed irregularly. In FIG. 3, illustration of the protrusions 8 is omitted, and only the plurality of recesses 7 is shown.

The plurality of protrusions 8 includes a melt re-hardening layer 9 formed by a part of the material of the substrate 2 that is re-hardened after melted by laser light irradiation. The melt re-hardening layer 9 may include a layer formed by a part of the material of the substrate 2 that is re-hardened after melted by laser light irradiation, at a position where the laser light is irradiated. The melt re-hardening layer 9 may include a layer formed by a part of the material of the substrate 2 that is re-hardened after melted and scattered to another region from the position where the laser light is irradiated.

A surface roughness (that is, an irregularity of the uneven structure) of the second main surface 4 of the substrate 2 is thus increased by the plurality of recesses 7 formed relatively regularly and the plurality of protrusions 8 famed irregularly.

Referring to FIG. 3, an insulating film 10 is formed in the second main surface 4 of the substrate 2. The insulating film 10 covers substantially entire region of the second main surface 4. The insulating film 10 includes a natural oxide film formed by oxidation of the substrate 2.

Referring to FIG. 4, the insulating film 10 includes a first portion 11 and a second portion 12. The first portion 11 of the insulating film 10 covers inner walls of the recesses 7. The second portion 12 of the insulating film 10 covers outside regions of the recesses 7.

A thickness T1 of the first portion 11 of the insulating film 10 is smaller than a thickness T2 of the second portion 12 of the insulating film 10. Although not shown, a thickness of the portion covering the protrusion 8 (the melt re-hardening layers 9) in the insulating film 10 is also smaller than the thickness T2 of the second portion 12 of the insulating film 10. The cause that the thickness T1 of the first portion 11 and the thickness T2 of the second portion 12 differ from each other is considered to be that a crystalline state of the substrate 2 is changed by the laser light irradiation.

Referring to FIG. 1 and FIG. 3, a surface insulating film 13 is formed on the first main surface 3 of the substrate 2. The surface insulating film 13 covers substantially entire region of the first main surface 3 of the substrate 2. The surface insulating film 13 is thus formed in a quadrangular shape matching the first main surface 3 of the substrate 2 in the planer view. The surface insulating film 13 may include one or both of an oxide film (an $SiO_2$ film) and a nitride film (an SiN film).

Referring to FIG. 3, a first pad electrode film 14 and a second pad electrode film 15 are formed on the surface insulating film 13 at intervals from each other. The first pad electrode film 14 is formed on one end portion side of the substrate 2 in a longitudinal direction of the substrate 2. The second pad electrode film 15 is formed on the other end portion side of the substrate 2 in the longitudinal direction of the substrate 2. The first pad electrode film 14 and the second pad electrode film 15 may be formed in a rectangular shape extending along a transverse direction of the substrate 2, respectively.

A functional device 16 is formed at a first main surface 3 side of the substrate 2. The functional device 16 is electrically connected to the first pad electrode film 14 and the second pad electrode film 15. In FIG. 2, the functional device 16 is shown simplified by cross-hatching.

The functional device 16 may include a functional device formed by using a surficial portion of the first main surface 3 of the substrate 2, a functional device formed by using the first main surface 3 of the substrate 2, and/or, a functional device formed by using a region above the first main surface 3 of the substrate 2.

In FIG. 2, an example in which the functional device 16 is formed in a region between the first pad electrode film 14 and the second pad electrode film 15 on the surface insulating film 13. Specific embodiment examples of the functional device 16 are to be described in detail later.

An insulating layer 17 is formed on the surface insulating film 13. The insulating layer 17 covers the first pad electrode film 14, the second pad electrode film 15 and the functional device 16. The insulating layer 17 includes a passivation film 18 and a resin film 19 laminated in this order from the surface insulating film 13 side. The passivation film 18 may include one or both of an oxide film (a $SiO_2$ film) and a nitride film (a SiN film). The resin film 19 may include polyimide.

A first pad opening 20 and a second pad opening 21 are formed in the insulating layer 17. The first pad opening 20 exposes a region excluding a peripheral edge portion of the first pad electrode film 14. The second pad opening 21 exposes a region excluding a peripheral edge portion of the second pad electrode film 15.

A first external terminal 22 is formed in the first pad opening 20. The first external terminal 22 is electrically connected to the first pad electrode film 14 in the first pad opening 20. The first external terminal 22 is thus electrically connected to the functional device 16 via the first pad electrode film 14.

The first external terminal 22 is formed so as to protrude from the insulating layer 17. The first external terminal 22 has the covering portion 22a covering the insulating layer 17. The first external terminal 22 may have a laminated structure where a plurality of metal films is laminated. The plurality of metal films may include an Ni film, a Pd film and an Au film laminated in this order from the first pad electrode film side.

A second external terminal 23 is formed in the second pad opening 21. The second external terminal 23 is electrically connected to the second pad electrode film 15 in the second pad opening 21. The second external terminal 23 is thus electrically connected to the functional device 16 via the second pad electrode film 15.

The second external terminal 23 is formed so as to protrude from the insulating layer 17. The second external terminal 23 has the covering portion 23a covering the insulating layer 17. The second external terminal 23 may have a laminated structure where a plurality of metal films is laminated. The plurality of metal films may include an Ni film, a Pd film and an Au film laminated in this order from the second pad electrode film 15 side.

Referring to FIG. 1 to FIG. 3, a sidewall insulating layer 24 is formed on the sidewall 5 of the substrate 2. The sidewall insulating layer 24 covers substantially entire region of the sidewall 5 of the substrate 2. The sidewall insulating layer 24 may extend to the insulating layer 17 from the sidewall 5 of the substrate 2 and may have the extending portion covering the insulating layer 17.

The extending portion of the sidewall insulating layer 24 may cover at least a sidewall of the passivation film 18. The extending portion of the sidewall insulating layer 24 may cover a sidewall of the passivation film 18 and a sidewall of the resin film 19.

The sidewall insulating layer 24 may have a laminated structure where a plurality of insulating films is laminated. The insulating film may include one or both of an oxide film (an $SiO_2$ film) and a nitride film (a SiN film). The sidewall insulating layer 24 may have a single layer structure including a single insulating film. The single insulating film may include an oxide film (an $SiO_2$ film) or a nitride film (a SiN film).

Figure 5:
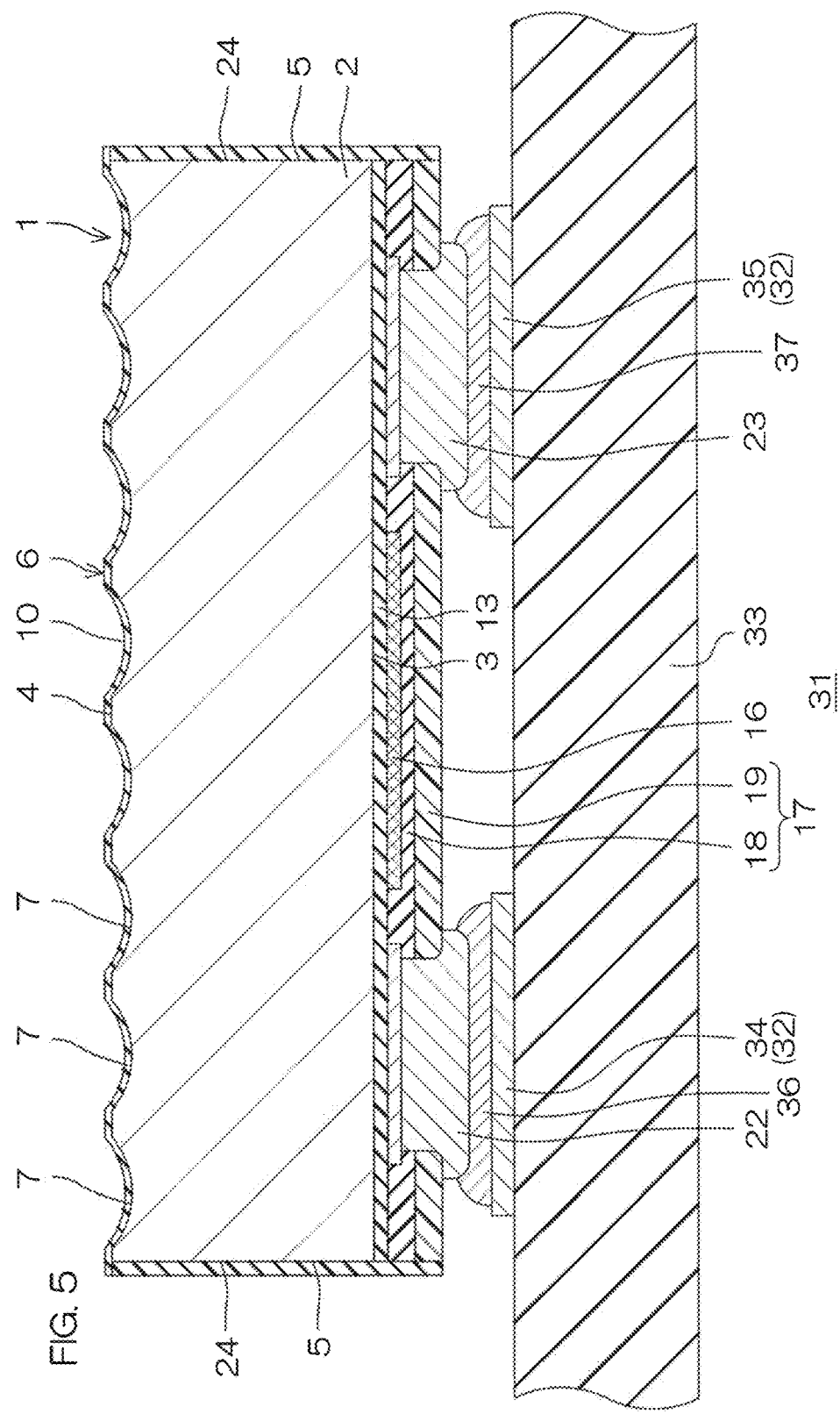
FIG. 5 is a cross sectional view showing a part of a circuit module including the chip part shown in FIG. 1.

FIG. 5 is a cross sectional view showing a part of a circuit module 31 including the chip part 1 shown in FIG. 1.

The circuit module 31 includes a mounting substrate 33 having a main surface, a wiring 32 formed at the main surface of the mounting substrate 33, and the chip part 1 mounted on the main surface of the mounting substrate 33.

The wiring 32 includes a first pad 34 and a second pad 35. The first pad 34 of the wiring 32 is to be connected to the first external terminal 22 of the chip part 1. The second pad 35 of the wiring 32 is to be connected to the second external terminal 23 of the chip part 1.

The chip part 1 is mounted on the main surface of the mounting substrate 33 in a posture where the first main surface 3 of the substrate 2 faces the main surface of the mounting substrate 33. The first external terminal 22 of the chip part 1 is bonded to the first pad 34 of the wiring 32 via the first conductive bonding material 36.

The second external terminal 23 of the chip part 1 is bonded to the second pad 35 of the wiring 32 via the second conductive bonding material 37. The first conductive bonding material 36 and the second conductive bonding material 37 may include solder or the like respectively.

Figure 6:
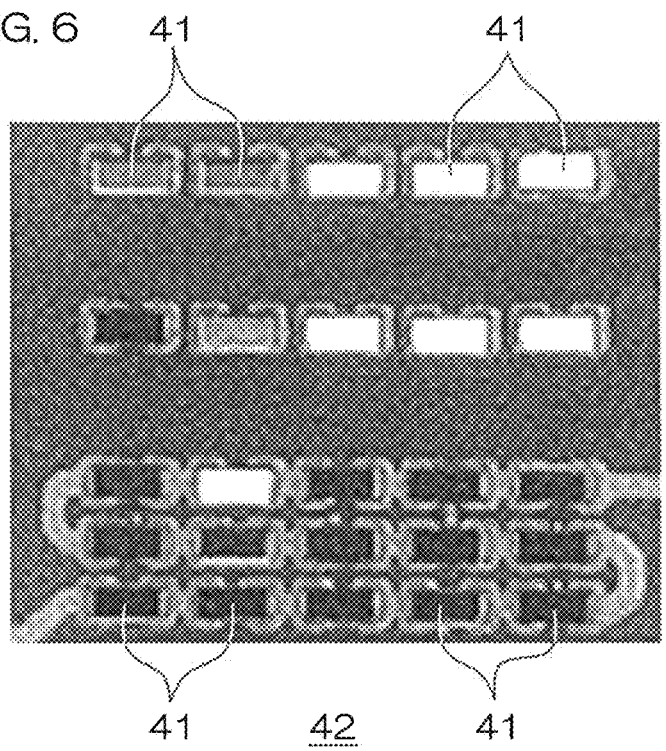
FIG. 6 is an image showing a result of an external appearance inspection performed to a chip part according to a reference example.

FIG. 6 is an image showing a result of an external appearance inspection performed to a chip part 41 according to a reference example (hereinafter simply referred to as "the chip part 41").

The chip part 41 has substantially same structure as the structure of the chip part 1, excluding that the substrate 2 has a mirrored second main surface 4 instead of the roughened second main surface 4. Detailed descriptions of the structure of the chip part 41 will be omitted.

Referring to FIG. 6, a first evaluation board 42 was prepared to perform the external appearance inspection for the chip part 41. A plurality of chip parts 41 was mounted on a main surface of the first evaluation board 42 in a posture where the first main surface 3 of the substrate 2 faced the main surface of the first evaluation board 42. The mounting conditions of the chip parts 41 with respect to the first evaluation board 42 were "normality".

The external appearance inspection for the chip part 41 was performed by an electronic microscope including an imaging device and a light source. The first evaluation board 42 was imaged by the imaging device in a state where the light was irradiated from the light source in the electronic microscope. The external appearance inspection for the chip part 41 was performed based on the image of the first evaluation board 42 obtained by imaging.

The plurality of chip parts 41 mounted on the first evaluation board 42 includes those appearing white, black or gray.

According to the chip part 41 appearing white, most of the light was reflected to the imaging device. According to the chip part 41 appearing black, most of the light was reflected to an outside region of the imaging device. According to the chip part 41 appearing gray, a part of the light was reflected to the imaging device.

Various causes can be considered as a reason that the color and tint differ among the plurality of chip parts 41. For example, a fact that the chip part 41 is mounted on the main surface of the first evaluation board 42 in a posture where the second main surface 4 of the substrate 2 is inclined with respect to the main surface of the first evaluation board 42 is exemplified as one cause. A fact that arrangement positions of the chip parts 41 with respect to the light source differ from each other is also exemplified as another cause.

As can be understood from FIG. 6, the variations in the color and tint of the chip parts 41 were caused in the obtained image, despite the mounting condition of the chip parts 41 being "normality", in the first evaluation board 42. Therefore, the smooth quality determination of the mounting condition of the chip part 41 is to be hindered.

Figure 7:
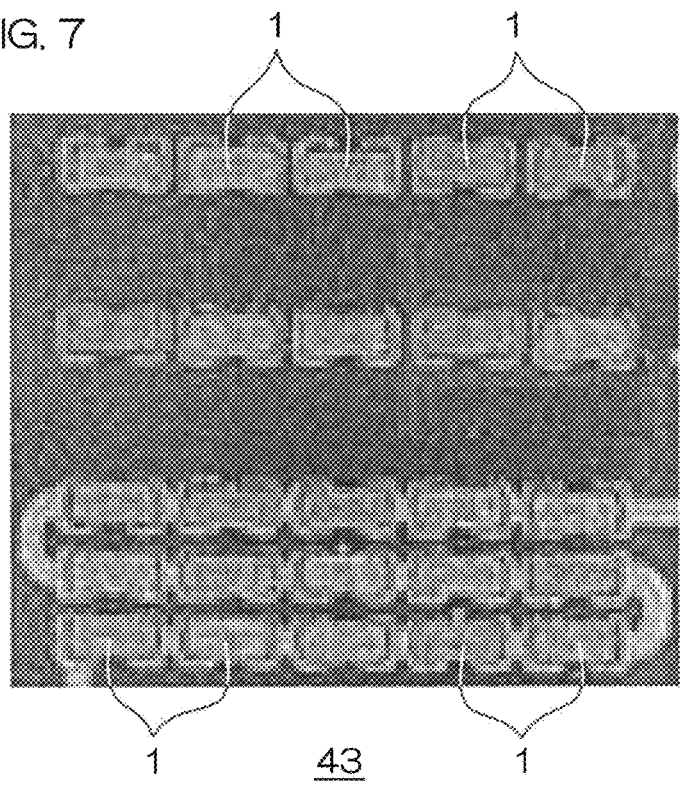
FIG. 7 is an image showing a result of an external appearance inspection performed to the chip part shown in FIG. 1.

FIG. 7 is an image showing a result of an external appearance inspection performed to the chip part 1 shown in FIG. 1.

Referring to FIG. 7, a second evaluation board 43 was prepared to perform the external appearance inspection for the chip part 1. A plurality of chip parts 1 was mounted on a main surface of the second evaluation board 43 in a posture where the first main surface 3 of the substrate 2 faced the main surface of the second evaluation board 43. The mounting conditions of the chip parts 1 with respect to the second evaluation board 43 were "normality".

The external appearance inspection for the chip part 1 was performed under condition similar to the condition of the external appearance inspection for the chip part 41. Referring to FIG. 7, the visual color change of each chip part 1 was smaller comparing to the case of the second evaluation board 43.

This reason is that the light irradiated toward the second main surface 4 of the substrate 2 was diffusely reflected by the light diffusion reflection structure 6. That is, according to the light diffusion reflection structure 6, the light can be diffusely reflected, so that an occurrence of a bias in the light reflection direction due to the arrangement position of the chip part 1 with respect to the light source can be suppressed. The occurrence of the variation in an incident amount of the light to the imaging device is also suppressed.

The chip part 1 having less visual color change can thus be judged as "normality" while the chip part 1 having greater visual color change can be judged as "abnormality", in the image obtained through the external appearance inspection. The chip part 1 capable of contributing the smooth external appearance inspection can thereby be provided.

In particular, according to the chip part 1, the light diffusion reflection structure 6 includes the plurality of recesses 7 formed at the second main surface 4 of the substrate 2. The light can thereby be diffusely reflected by the inner walls of the plurality of recesses 7. Furthermore, the light diffusion reflection structure 6 includes the plurality of protrusions 8 irregularly formed in the second main surface 4 of the substrate 2.

The light can thus be diffusely reflected by surfaces of the plurality of protrusions 8, so that the bias in the light reflection direction can be further suppressed. The mounting condition of the chip part 1 can thereby be appropriately detected by the imaging device.

Also, a shadow region can be formed in the second main surface 4 of the substrate 2 by the plurality of recesses 7. The tint of the chip part 1 in the obtained image can thus be adjusted. The occurrence of the variation in the color and tint of each chip part 1 can thereby be suppressed.

Referring to FIG. 5, the circuit module 31 including the mounting substrate 33 having the main surface, and the chip part 1 mounted onto the main surface of the mounting substrate 33 can also be provided. The chip part 1 is mounted onto the main surface of the mounting substrate 33 in the posture where the first main surface 3 of the substrate 2 is faced to the main surface of the mounting substrate 33 in the circuit module 31.

In a case where the external appearance inspection is performed with respect to the circuit module 31, and/or, the chip part 1 incorporated in the circuit module 31, the light can be irradiated toward the second main surface 4 of the substrate 2. The external appearance inspection can thereby be smoothly performed with respect to the circuit module 31, and/or, the chip part 1 incorporated in the circuit module 31 as well.

FIG. 8A to FIG. 8K are cross sectional views for explaining a manufacturing method of the chip part 1 shown in FIG. 1. According to the manufacturing method of the present preferred embodiment, the plurality of chip parts 1 is manufactured simultaneously, but only a region where two pieces of the chip parts 1 are to be formed is shown for convenience in FIG. 8A to FIG. 8K.

First, referring to FIG. 8A, a base substrate 52 is prepared. The base substrate 52 has a first main surface 53 and a second main surface 54 corresponding to the first main surface 3 and the second main surface 4 of the substrate 2 respectively. A plurality of chip part forming regions 55 is set to the first main surface 53 of the base substrate 52.

The plurality of chip part forming regions 55 is corresponding to the chip part 1 respectively and defined by a boundary region 56. After performing predetermined processes to the base substrate 52, the base substrate 52 is cut along peripheries of the chip part forming regions 55 (that is, the boundary region 56).

After preparation of the base substrate 52, the surface insulating film 13 is formed on the first main surface 53 of the base substrate 52. The surface insulating film 13 may be formed by a thermal oxidation treatment or a chemical vapor deposition (CVD) method. In the thermal oxidation treatment, the first main surface 53 of the base substrate 52 is oxidized. In the CVD method, an insulating material is deposited on the first main surface 53 of the base substrate 52.

Figure 8G:
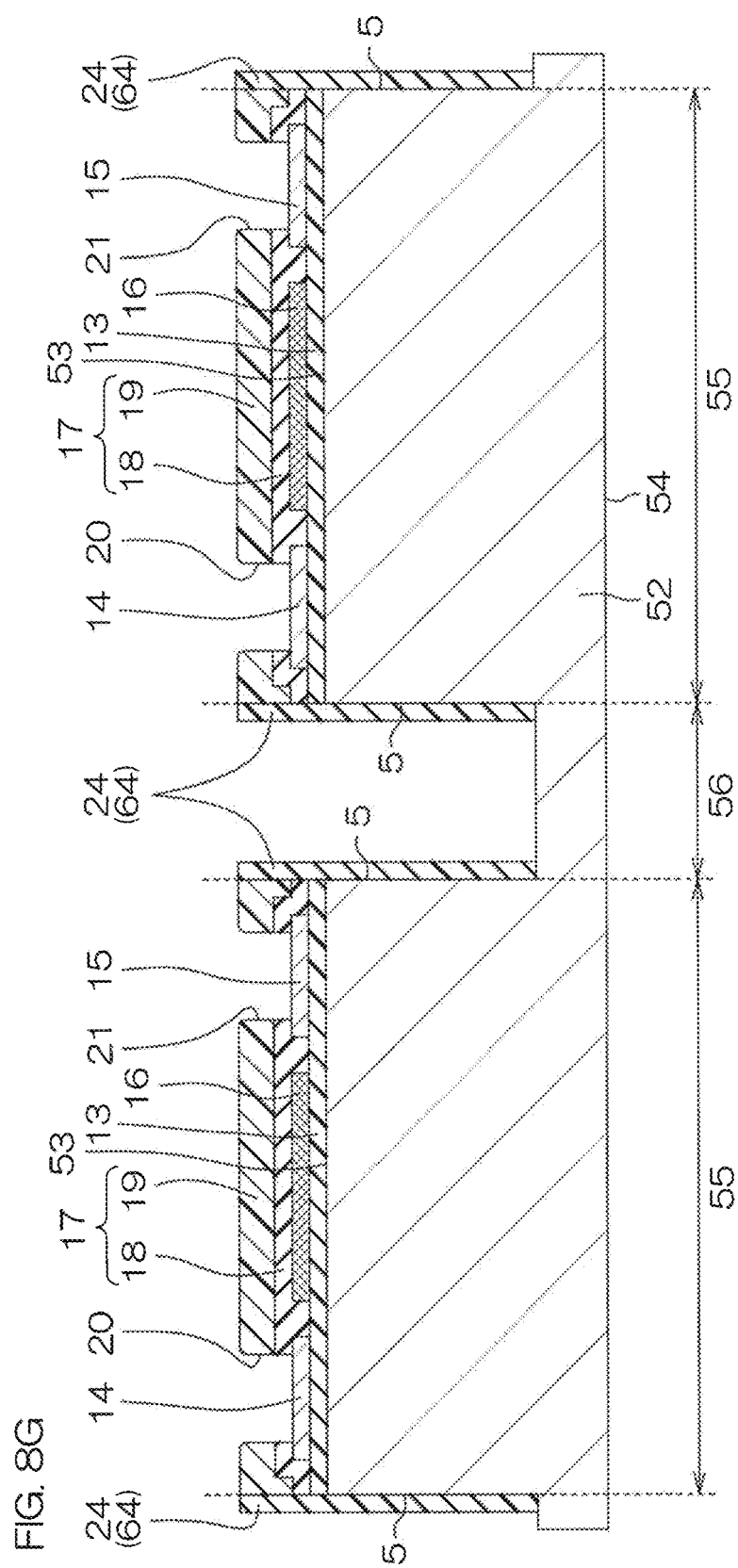

Next, referring to FIG. 8B, the functional device 16 is formed in each of the chip part forming regions 55. An example where the functional device 16 is formed on the surface insulating film 13 is shown, in the present preferred embodiment. In FIG. 8B, the functional device 16 is shown simplified by cross hatching (hereinafter the same in FIG. 8C to FIG. 8K).

The first pad electrode film 14 and the second pad electrode film 15 are formed on the surface insulating film 13. The first pad electrode film 14 and the second pad electrode film 15 are respectively formed in the plurality of chip part forming regions 55 so as to be electrically connected to the functional device 16.

In this step, first, a base electrode film to be a basis of the first pad electrode film 14 and the second pad electrode film 15 is formed on the surface insulating film 13. The base electrode film may be foamed by a sputtering method. Next, unnecessary portions of the base electrode film are removed by an etching method via a mask. The first pad electrode film 14 and the second pad electrode film 15 are thereby formed.

Next, referring to FIG. 8C, the passivation film 18 is formed on the surface insulating film 13. The passivation film 18 is formed so as to cover the first pad electrode film 14, the second pad electrode film 15 and the functional device 16. The passivation film 18 may be formed by a CVD method.

Next, the resin film 19 is formed on the passivation film 18. The resin film 19 may be formed by applying the photosensitive polyimide to the passivation film 18. The insulating layer 17 including the passivation film 18 and the resin film 19 can thus be formed.

Next, a plurality of openings 57, 58, 59 is formed in the resin film 19. The plurality of openings 57, 58, 59 is formed by selectively exposing and developing the resin film 19. The opening 57 has a pattern corresponding to the boundary region 56. The opening 58 has a pattern corresponding to the first pad opening 20. The opening 59 has a pattern corresponding to the second pad opening 21.

Next, referring to FIG. 8D, unnecessary portions of the passivation film 18 are removed. Unnecessary portions of the passivation film 18 are removed by an etching method where the resin film 19 is used as a mask. The first pad opening 20, the second pad opening 21, and the opening 60 exposing the boundary region 56 are formed in the insulating layer 17.

Next, referring to FIG. 8E, a mask 62 having a predetermined pattern is formed on the first main surface 53 of the base substrate 52. The mask 62 selectively has the opening 61 exposing the boundary region 56.

Next, unnecessary portions of the base substrate 52 are removed. Unnecessary portions of the base substrate 52 are removed by an etching method via the mask 62. The etching method may be an anisotropic etching (e.g. a Reactive Ion Etching (RIE)). A groove 63 defining each of the plurality of chip part forming regions 55 is formed in the base substrate 52. The mask 62 is removed thereafter.

Next, referring to FIG. 8F, the insulating layer 64 is formed so as to cover an inner wall of the groove 63 and the plurality of chip part forming regions 55. The insulating layer 64 may be formed by a CVD method. In the CVD method, the insulating material is deposited on the first main surface 53 of the base substrate 52.

The step of depositing the insulating material may be performed multiple times (two or more times). In this case, the insulating layer 64 having the laminated structure where a plurality of insulating films is laminated in this order from the base substrate 52 side is formed.

Next, referring to FIG. 8G, the insulating layer 64 is selectively removed. The insulating layer 64 may be removed by an etching method. The etching method may be an anisotropic etching (e.g. a Reactive Ion Etching (RIE)).

In this step, a portion parallel to the first main surface 53 of the base substrate 52 in the insulating layer 64 is removed so that a portion covering a sidewall of the groove 63 in the insulating layer 64 remains. The portion covering the sidewall of the groove 63 in the insulating layer 64 is thus to be the sidewall insulating layer 24. A part of the insulating layer 64 may remain so as to cover an inner wall of the first pad opening 20 and an inner wall of the second pad opening 21.

Next, referring to FIG. 8H, the first external terminal 22 and the second external terminal 23 are formed. In this step, the Ni film, the Pd film and the Au film are famed in this order from the first pad electrode film 14 exposed from the first pad opening 20. The Ni film, the Pd film and the Au film are also formed in this order from the second pad electrode film 15 exposed from the second pad opening 21. The Ni film, the Pd film and the Au film may be formed by electrolytic plating method respectively.

Next, referring to FIG. 8I, a support tape 65 for supporting the base substrate 52 is stuck to the first main surface 53 side of the base substrate 52. The support tape 65 may be a resin tape.

Next, the second main surface 54 of the base substrate 52 is ground to the groove 63. Grinding of the base substrate 52 may be performed by a chemical mechanical polishing (CMP) method.

The base substrate 52 is thereby cut along the groove 63, so that a plurality of pieces of the substrates 2 are cut out from the base substrate 52. The first main surface 53 and the second main surface 54 of the base substrate 52 are to be the first main surface 3 and the second main surface 4 of the substrate 2. The sidewall of the groove 63 in the base substrate 52 is to be the sidewall 5 of the substrate 2.

Next, referring to FIG. 8J, each of the substrates 2 is arranged on a main surface of a support plate 66. Each of the substrates 2 is arranged on the main surface of the support plate 66 in a posture where the first main surface 3 faces the main surface of the support plate 66. As shown in FIG. 8J, the plurality of substrates 2 may be arranged together on the main surface of the support plate 66 in a state where the support tape 65 is stuck to the first main surface 3 side of each of the substrates 2.

Figure 8K:
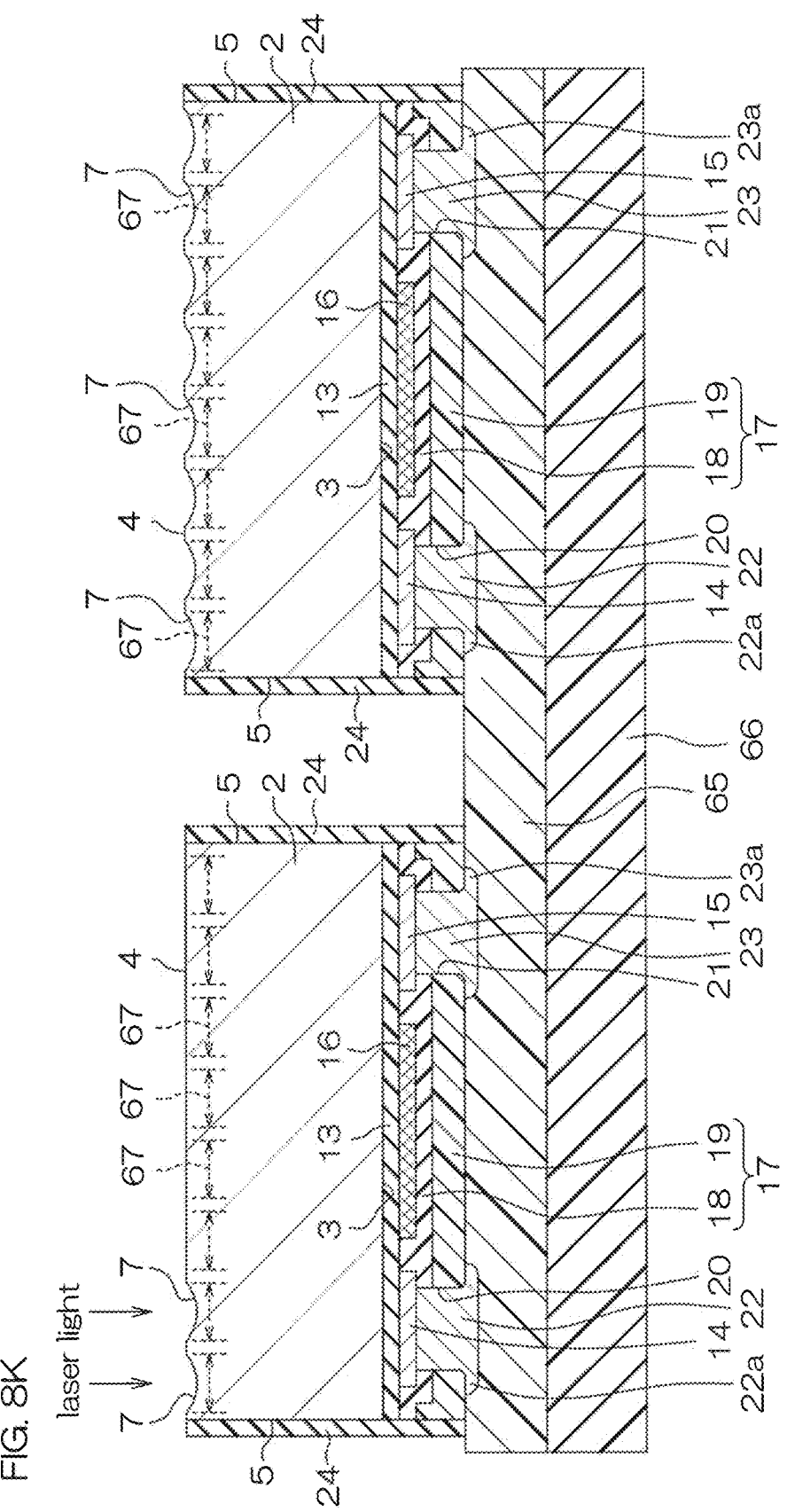

Next, referring to FIG. 8K, the second main surface 4 of each of the substrates 2 is roughened. The second main surface 4 of each of the substrates 2 is roughened by a laser light irradiation method, in the present preferred embodiment. In this step, a light condensing portion is matched to a surficial portion of the second main surface 4 of the substrate 2. Then, laser light is irradiated to the second main surface 4 of the substrate 2 from the second main surface 4 side of the substrate 2.

A plurality of laser light irradiation region 67 is set to the second main surface 4 of the substrate 2, in the present preferred embodiment. The plurality of laser light irradiation region 67 is set to a stripe pattern corresponding to the plurality of recesses 7.

More specifically, the plurality of laser light irradiation regions 67 is set at intervals from each other along the first direction (the longitudinal direction of the substrate 2). The plurality of laser light irradiation regions 67 is also set to the belt-shape extending along the second direction (the transverse direction of the substrate 2) orthogonal to the first direction. Then, the laser light is irradiated to each laser light irradiation region 67.

A laser processing traces are formed in a region where the laser light is directly irradiated in the second main surface 4 of the substrate 2. The recesses 7 are formed by the laser processing traces. The stripe pattern including the plurality of recesses 7 is thus formed.

Further, in this step, a part of a material of the substrate 2 is re-harden after melted by irradiation of laser light, at a position where the laser light is irradiated. A part of a material of the substrate 2 is re-harden after being scattered to the inside regions of the recesses 7 and the outside regions of the recesses 7.

The plurality of melt re-hardening layers 9 is thereby irregularly formed in the second main surface 4 of the substrate 2. The plurality of protrusions 8 (see also FIG. 2) is formed by the plurality of melt re-hardening layers 9. The second main surface 4 of the substrate 2 is roughened by the plurality of recesses 7 and the plurality of protrusions 8. The insulating film 10 covering the second main surface 4 of the substrate 2 is formed thereafter, and the chip part 1 is manufactured.

The specific embodiment example of the functional device 16 will be described in detail as below. The functional device 16 described above may include at least one of a resistance R, a capacitor C, an inductance L or a diode D, in the chip part 1.

Hereinafter, a first embodiment example where the functional device 16 includes the resistance R, a second embodiment example where the functional device 16 includes the capacitor C, a third embodiment example where the functional device 16 includes the inductance L, and a fourth embodiment example where the functional device 16 includes the diode D will be described in this order.

Figure 9:
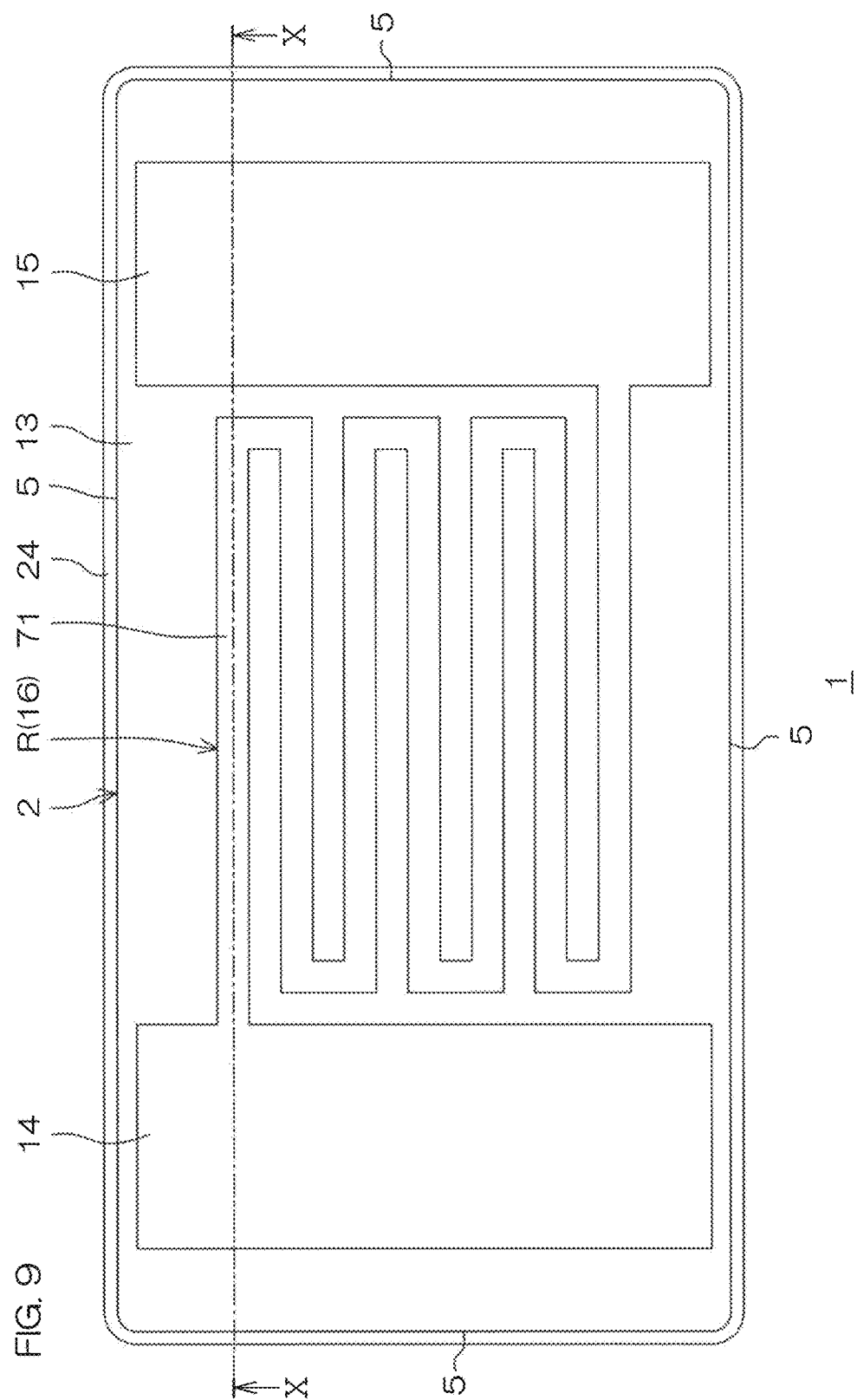
FIG. 9 is a plan view showing internal structures of the chip part shown in FIG. 1 and showing a first embodiment example of a functional device.
Figure 10:
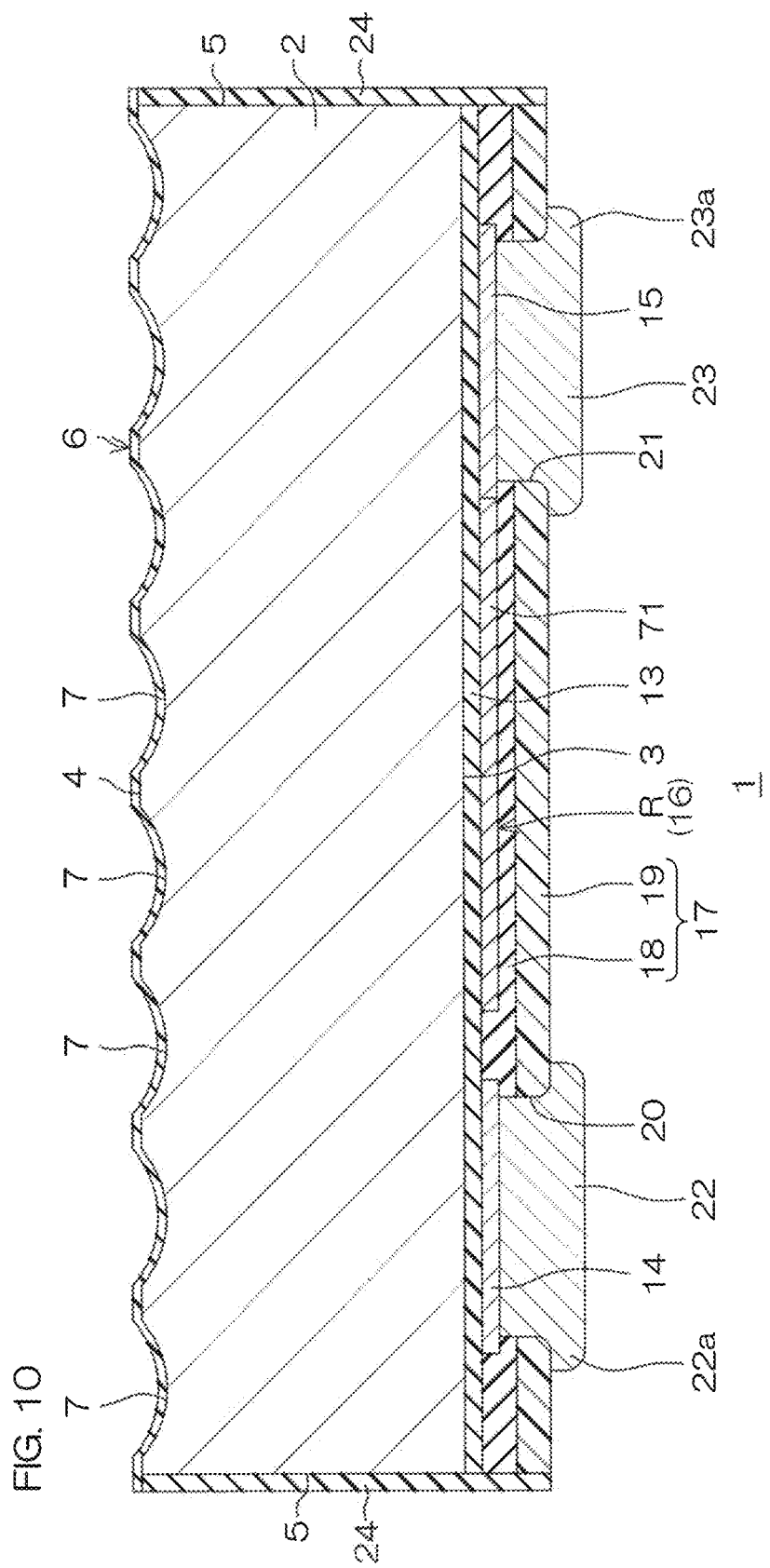
FIG. 10 is a cross sectional view taken along line X-X shown in FIG. 9 and showing the chip part being in a face-down posture.

FIG. 9 is a plan view showing internal structures of the chip part 1 shown in FIG. 1 and showing the first embodiment example of the functional device 16. FIG. 10 is a cross sectional view taken along line X-X shown in FIG. 9 and showing the chip part 1 being in a face-down posture. In this embodiment example, the same reference numerals are applied to the same structures as those described in the preferred embodiment, and the descriptions thereof will be omitted.

Referring to FIG. 9 and FIG. 10, the chip part 1 includes the resistance R as the functional device 16. The resistance R is formed on the surface insulating film 13. The resistance R is formed in a region between the first pad electrode film 14 and the second pad electrode film 15.

The resistance R is electrically connected to the first pad electrode film 14 and the second pad electrode film 15. More specifically, the resistance R includes a resistance conductive film 71 formed in the region between the first pad electrode film 14 and the second pad electrode film 15.

An example where the resistance conductive film 71 extending in the belt-shape is drawn in a zigzag manner is shown in FIG. 9. The resistance conductive film 71 may extend linearly in the region between the first pad electrode film 14 and the second pad electrode film 15.

The resistance conductive film 71 is preferably made of a metal material having a resistivity higher than the resistivity of copper. The resistance conductive film 71 may include a Ti film or a TiN film. The resistance conductive film 71 may have a laminated structure including a Ti film, and a TiN film laminated on the Ti film.

The functional device 16 (the resistance R), the first pad electrode film 14 and the second pad electrode film 15 are formed through the following steps in the step of FIG. 8B.

First, a base electrode film (e.g. a Ti film) to be a basis of the resistance conductive film 71, the first pad electrode film 14 and the second pad electrode film 15 is formed on the surface insulating film 13. The base electrode film may be formed by a sputtering method.

Next, a mask having a predetermined pattern is formed on the base electrode film. The mask has openings corresponding to the resistance conductive film 71, the first pad electrode film 14 and the second pad electrode film 15.

Next, unnecessary portions of the base electrode film are removed by an etching method via the mask. The resistance conductive film 71, the first pad electrode film 14 and the second pad electrode film 15 are thereby formed on the surface insulating film 13. Thereafter, the steps of FIG. 8C to FIG. 8K are performed in this order. Through those steps, the chip part 1 having the resistance R as the functional device 16 is manufactured.

As described above, the chip part 1 is a chip resistor having the resistance R as the functional device 16. The chip resistor capable of contributing the smooth external appearance inspection can thus be provided.

Figure 11:
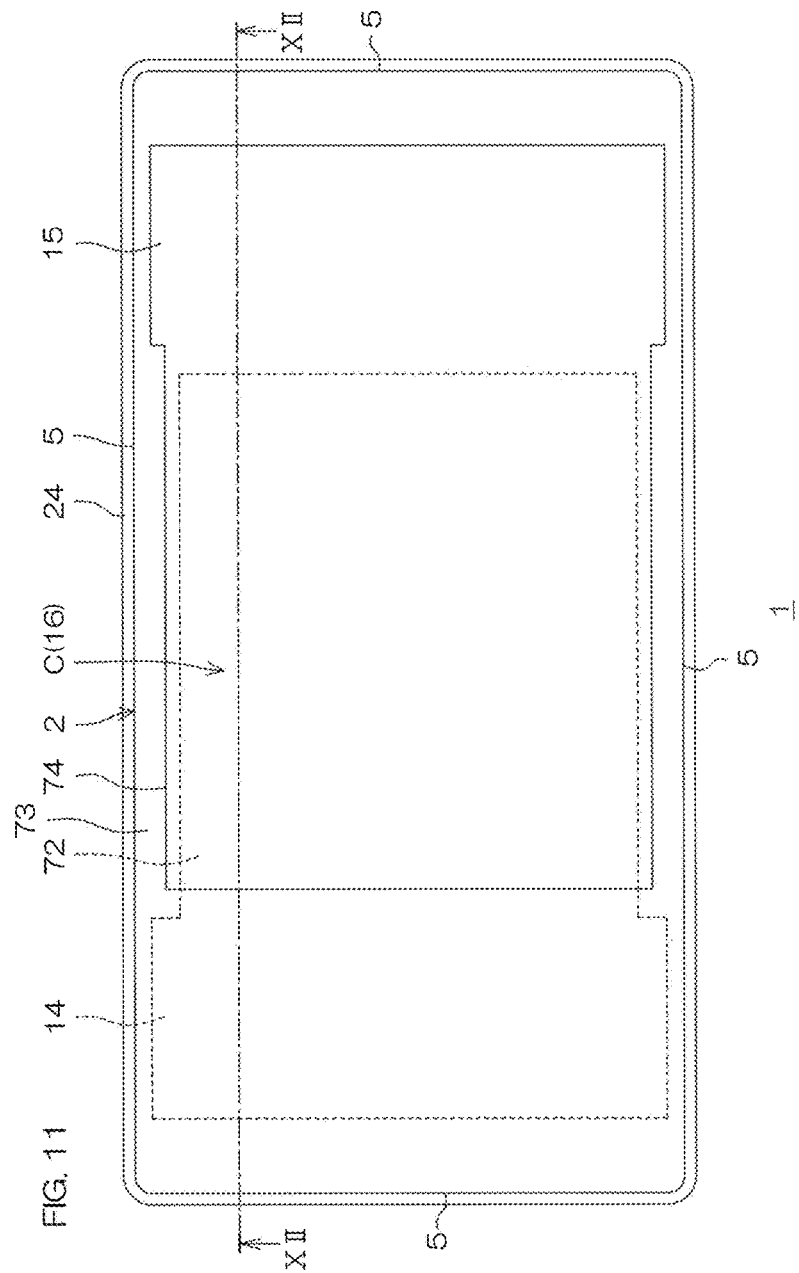
FIG. 11 is a plan view showing internal structures of the chip part shown in FIG. 1 and showing a second embodiment example of a functional device.
Figure 12:
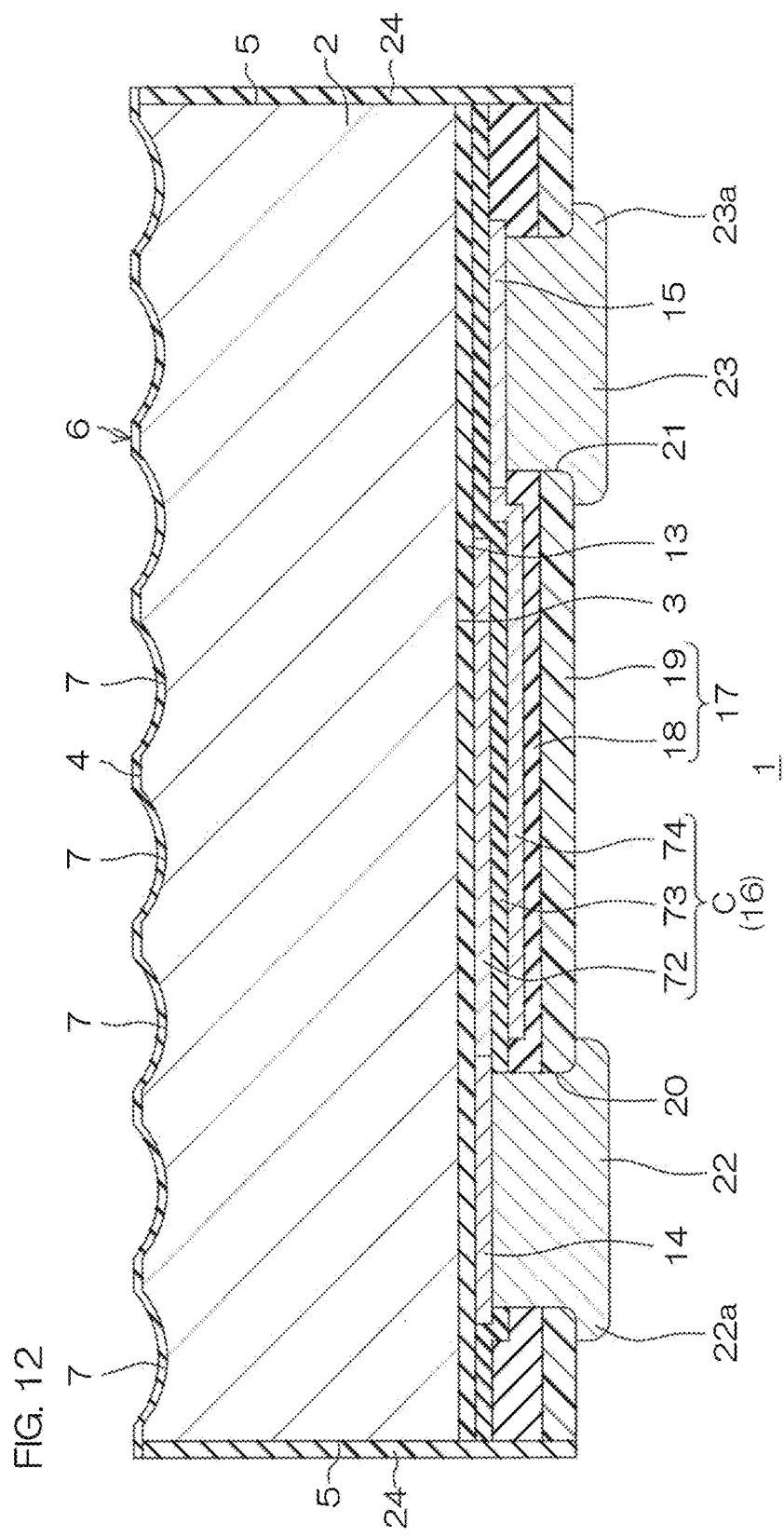
FIG. 12 is a cross sectional view taken along line XII-XII shown in FIG. 11 and showing the chip part being in a face-down posture.

FIG. 11 is a plan view showing internal structures of the chip part 1 shown in FIG. 1 and showing the second embodiment example of the functional device 16. FIG. 12 is a cross sectional view taken along line XII-XII shown in FIG. 11 and showing the chip part 1 being in a face-down posture. In this embodiment example, the same reference numerals are applied to the same structures as those described in the preferred embodiment, and the descriptions thereof will be omitted.

Referring to FIG. 11 and FIG. 12, the chip part 1 includes the capacitor C as the functional device 16. The capacitor C is formed on the surface insulating film 13. The capacitor C is formed in a region between the first pad electrode film 14 and the second pad electrode film 15. The capacitor C is electrically connected to the first pad electrode film 14 and the second pad electrode film 15.

The capacitor C has a laminated structure in which a first electrode film 72, a dielectric film 73 and a second electrode film 74 are laminated in this order from the surface insulating film 13 side.

The first electrode film 72 is formed on the surface insulating film 13. The first electrode film 72 is electrically connected to the first pad electrode film 14. More specifically, the first electrode film 72 is formed integrally with the first pad electrode film 14 as a led-out electrode film led out from the first pad electrode film 14 toward the second pad electrode film 15.

The dielectric film 73 is formed on the first electrode film 72. The dielectric film 73 also covers the surface insulating film 13.

The second electrode film 74 is famed on the dielectric film 73. The second electrode film 74 is electrically connected to the second pad electrode film 15. More specifically, the second electrode film 74 is formed on the dielectric film 73 together with the second pad electrode film 15. The second electrode film 74 is formed integrally with the second pad electrode film 15 as a led-out electrode film led out from the second pad electrode film 15 toward the first pad electrode film 14.

The functional device 16 (the capacitor C), the first pad electrode film 14 and the second pad electrode film 15 are formed through the following steps in the step of FIG. 8B.

First, a first base electrode film to be a basis of the first pad electrode film 14 and the first electrode film 72 is formed on the surface insulating film 13. The first base electrode film may be formed by a sputtering method.

Next, a mask having a predetermined pattern is formed on the first base electrode film. The mask covers regions to be the first pad electrode film 14 and the first electrode film 72.

Next, unnecessary portions of the first base electrode film are removed by an etching method via the mask. The first pad electrode film 14 and the first electrode film 72 are thereby formed on the surface insulating film 13.

Next, the dielectric film 73 is formed on the surface insulating film 13. The dielectric film 73 is formed so as to cover the first pad electrode film 14 and the first electrode film 72. The dielectric film 73 may be formed by a CVD method.

The dielectric film 73 may include an ONO film where an oxide film (an $SiO_2$ film), a nitride film (an SiN film) and an oxide film (an $SiO_2$ film) are laminated in this order from the surface insulating film 13 side by a CVD method.

Next, a second base electrode film to be a basis of the second pad electrode film 15 and the second electrode film 74 is formed on the dielectric film 73. The second base electrode film may be formed by a sputtering method.

Next, a mask having a predetermined pattern is formed on the second base electrode film. The mask covers regions to be the second pad electrode film 15 and the second electrode film 74.

Next, unnecessary portions of the second base electrode film are removed by an etching method via the mask. The second pad electrode film 15 and the second electrode film 74 are thereby formed on the dielectric film 73. Thereafter, the steps of FIG. 8C to FIG. 8K are performed in this order. Through those steps, the chip part 1 having the capacitor C as the functional device 16 is manufactured.

As described above, the chip part 1 is a chip capacitor having the capacitor C as the functional device 16. The chip capacitor capable of contributing the smooth external appearance inspection can thus be provided.

Figure 13:
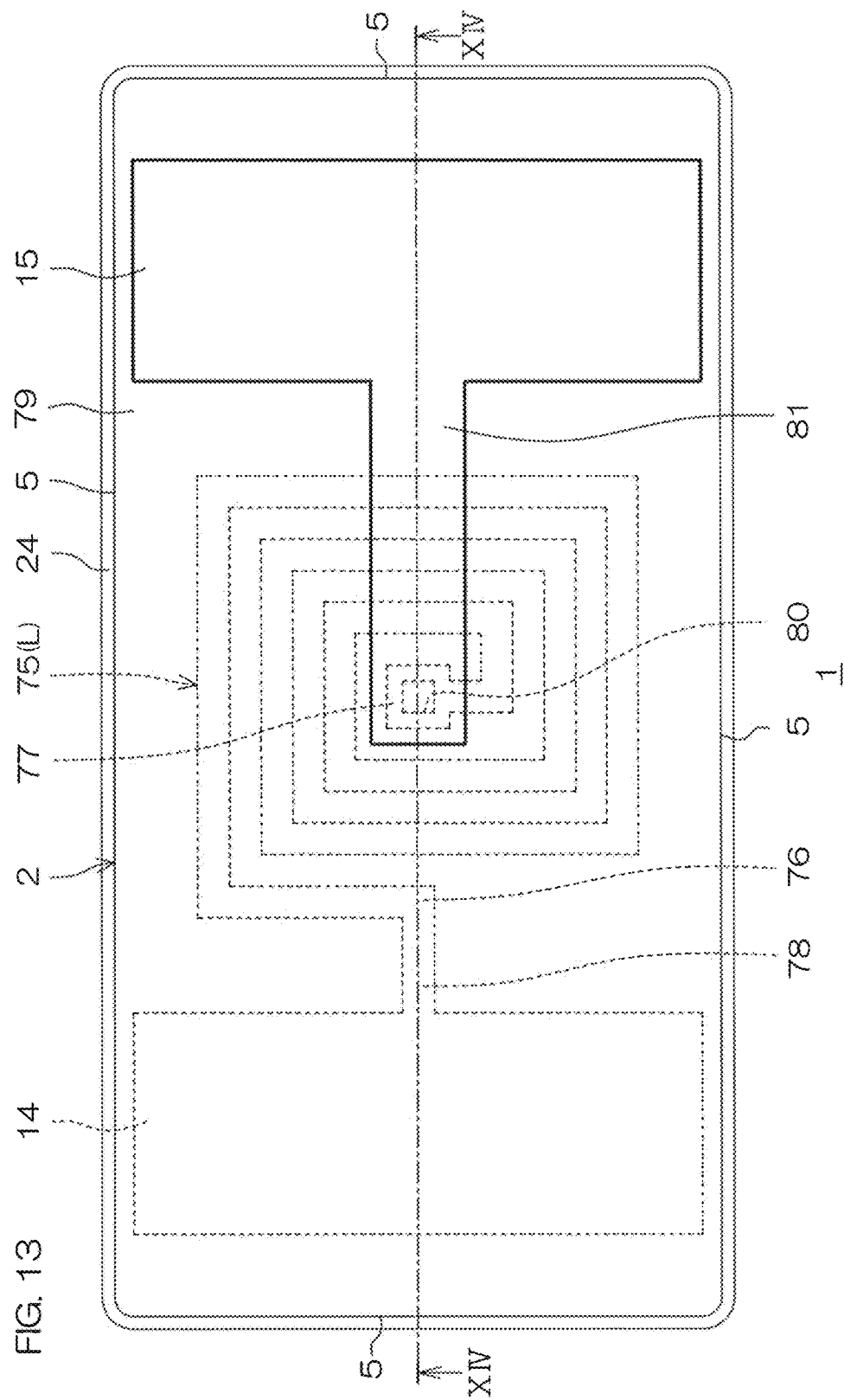
FIG. 13 is a plan view showing internal structures of the chip part shown in FIG. 1 and showing a third embodiment example of a functional device.
Figure 14:
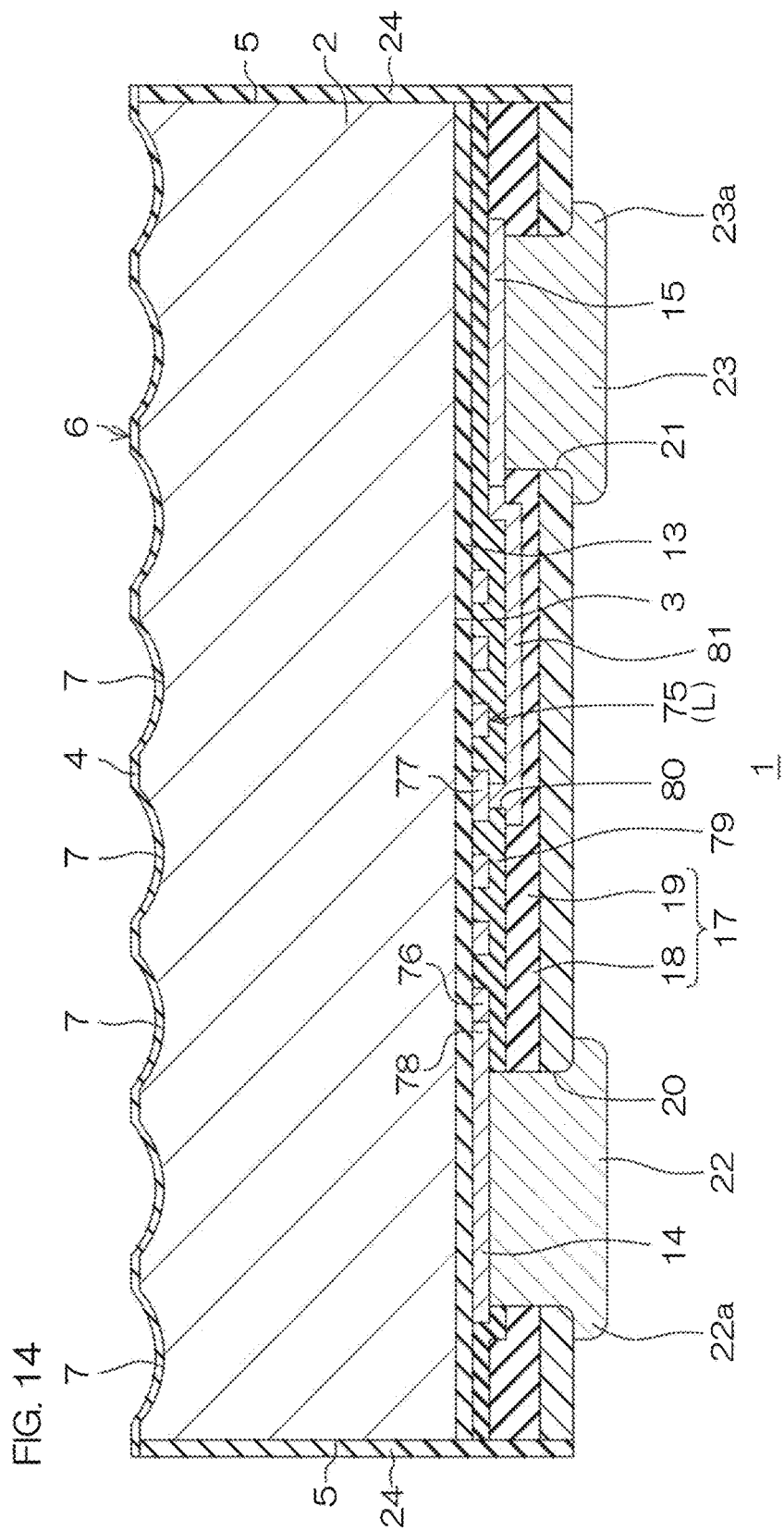
FIG. 14 is a cross sectional view taken along line XIV-XIV shown in FIG. 13 and showing the chip part being in a face-down posture.

FIG. 13 is a plan view showing internal structures of the chip part 1 shown in FIG. 1 and showing the third embodiment example of a functional device 16. FIG. 14 is a cross sectional view taken along line XIV-XIV shown in FIG. 13 and showing the chip part 1 being in a face-down posture. In this embodiment example, the same reference numerals are applied to the same structures as those described in the preferred embodiment, and the descriptions thereof will be omitted.

Referring to FIG. 13 and FIG. 14, the chip part 1 includes the inductance L as the functional device 16. The inductance L is formed on the surface insulating film 13. The inductance L is formed in a region between the first pad electrode film 14 and the second pad electrode film 15. The inductance L is electrically connected to the first pad electrode film 14 and the second pad electrode film 15.

More specifically, the inductance L includes the coil conductive film 75 formed in a spiral shape in the planer view. The coil conductive film 75 includes an outer coil end 76 and an inner coil end 77. The outer coil end 76 is located at an outermost periphery of the spiral. The inner coil end 77 is located at a center of the spiral.

A first connection electrode film 78 is formed on the surface insulating film 13. The first connection electrode film 78 is connected to the first pad electrode film 14 and the outer coil end 76.

A coil insulating film 79 is formed on the surface insulating film 13. The coil insulating film 79 covers the first pad electrode film 14, the coil conductive film 75 and the first connection electrode film 78. A contact hole 80 is formed in the coil insulating film 79. The contact hole 80 exposes the inner coil end 77 of the coil conductive film 75.

The second pad electrode film 15 is formed on the coil insulating film 79. Further, a second connecting electrode film 81 is formed on the coil insulating film 79. The second pad electrode film 15 is connected to the inner coil end 77 of the coil conductive film 75 via the second connecting electrode film 81.

The second connecting electrode film 81 is led out from the second pad electrode film 15 towards the contact hole 80. The second connecting electrode film 81 is entered the contact hole 80 from above the coil insulating film 79. The second connecting electrode film 81 is electrically connected to the inner coil end 77 of the coil conductive film 75 in the contact hole 80.

The functional device 16 (the inductance L), the first pad electrode film 14 and the second pad electrode film 15 are formed through the following steps in the step of FIG. 8B.

First, a first base electrode film to be a basis of the first pad electrode film 14, the coil conductive film 75 and the first connection electrode film 78 is formed on the surface insulating film 13. The first base electrode film may be formed by a sputtering method.

Next, a mask having a predetermined pattern is formed on the first base electrode film. The mask covers regions to be the first pad electrode film 14, the coil conductive film 75 and the first connection electrode film 78.

Next, unnecessary portions of the first base electrode film are removed by an etching method via the mask. The first pad electrode film 14, the coil conductive film 75 and the first connection electrode film 78 are thereby formed on the surface insulating film 13.

Next, the coil insulating film 79 is formed on the surface insulating film 13. The coil insulating film 79 covers the first pad electrode film 14, the coil conductive film 75 and the first connection electrode film 78. The coil insulating film 79 may be formed by a CVD method.

Next, unnecessary portions of the coil insulating film 79 are selectively removed by an etching method via the mask. The contact hole 80 exposing the inner coil end 77 of the coil conductive film 75 is thereby formed in the coil insulating film 79.

Next, a second base electrode film to be a basis of the second pad electrode film 15 and the second connecting electrode film 81 is formed on the coil insulating film 79. The second base electrode film may be formed by an sputtering method.

Next, a mask having a predetermined pattern is formed on the coil insulating film 79. The mask covers regions to be the second pad electrode film 15 and the second connecting electrode film 81.

Next, unnecessary portions of the second base electrode film are removed by an etching method via the mask. The second pad electrode film 15 and the second connecting electrode film 81 are thereby formed on the coil insulating film 79. Thereafter, the steps of FIG. 8C to FIG. 8K are performed in this order. Through those steps, the chip part 1 having the inductance L as the functional device 16 is manufactured.

As described above, the chip part 1 is a chip inductor having the inductance L as the functional device 16. The chip inductor capable of contributing the smooth external appearance inspection can thus be provided.

Figure 15:
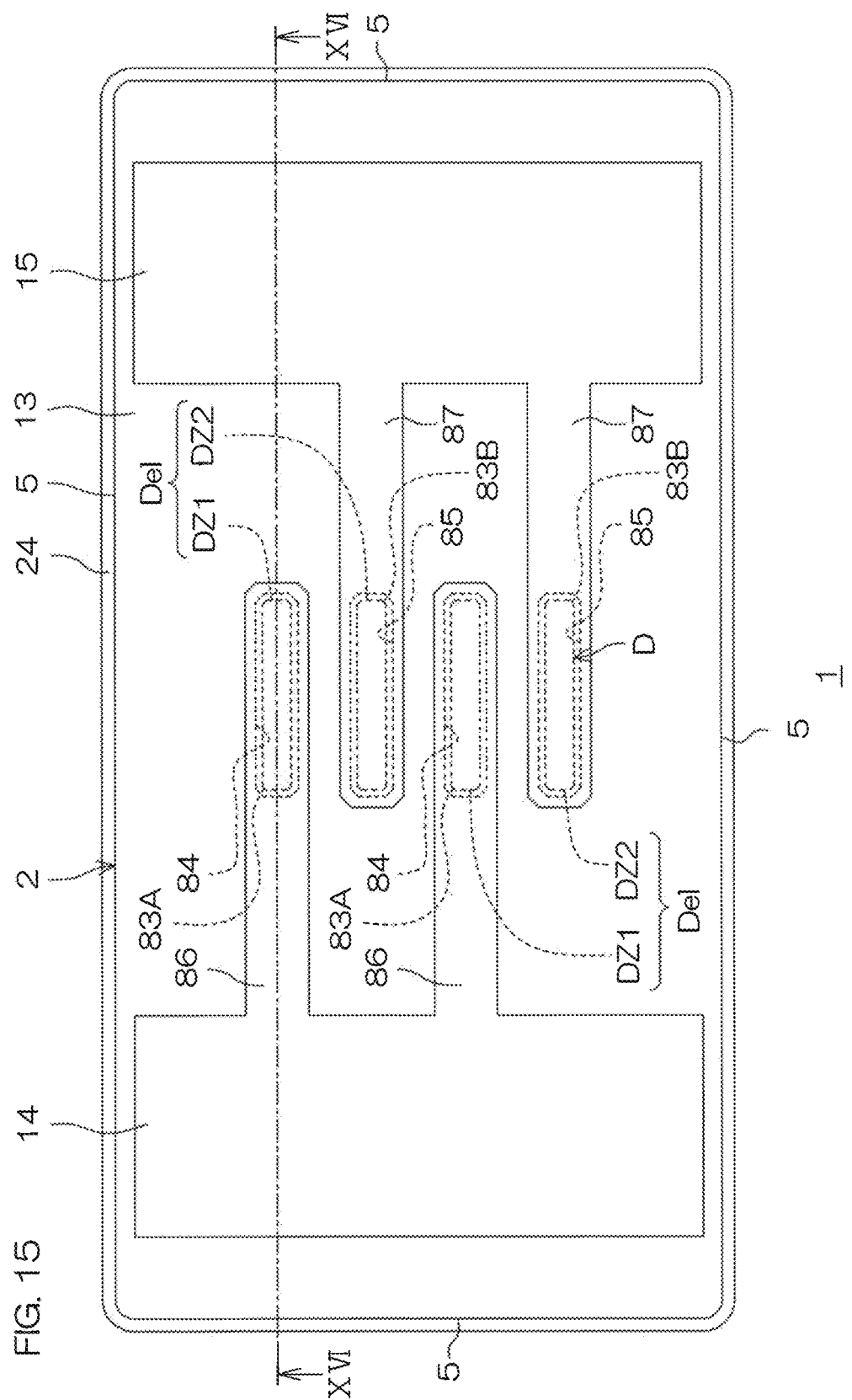
FIG. 15 is a plan view showing internal structures of the chip part shown in FIG. 1 and showing a forth embodiment example of a functional device.
Figure 16:
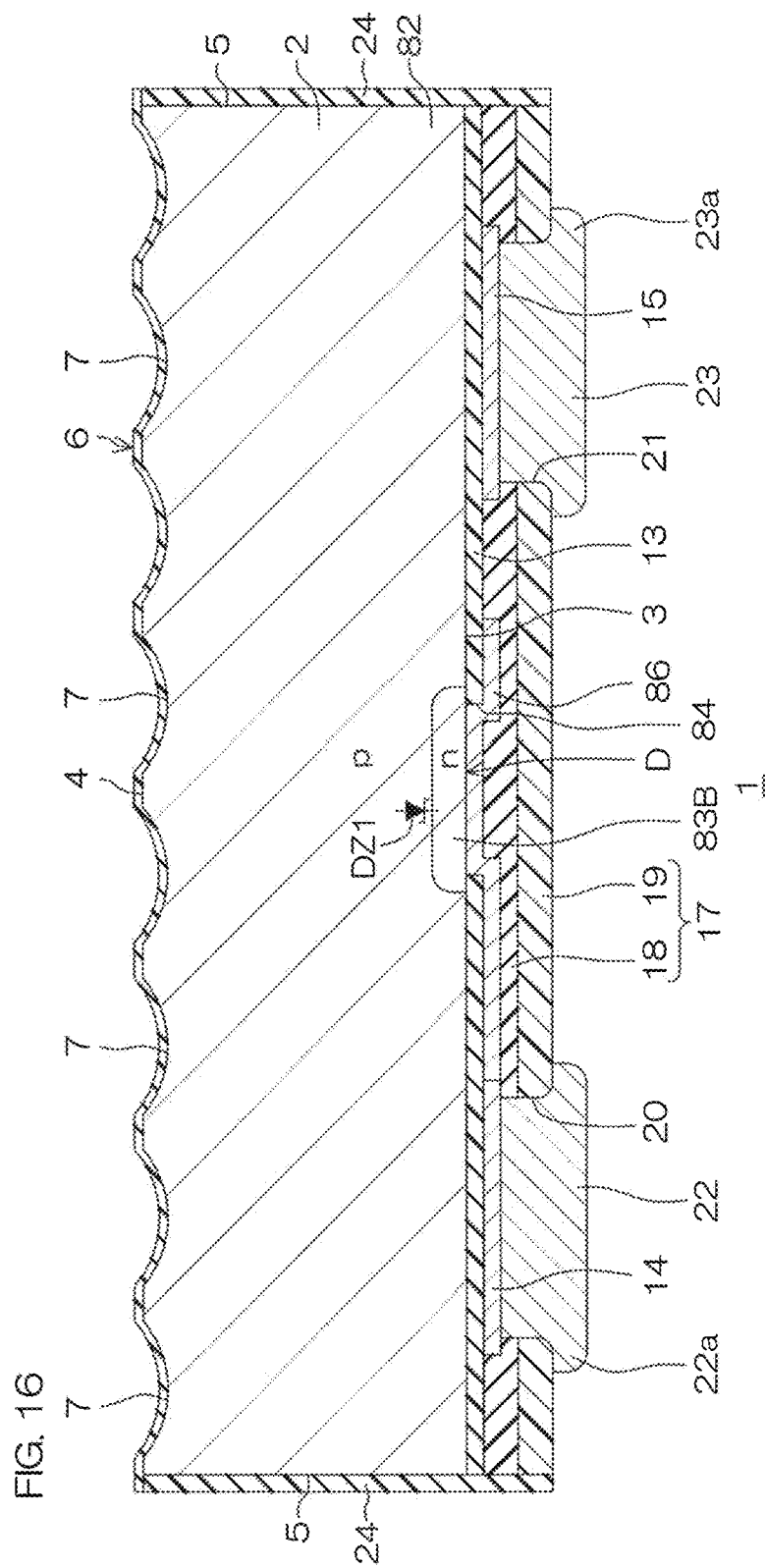
FIG. 16 is a cross sectional view taken along line XVI-XVI shown in FIG. 15 and showing the chip part being in a face-down posture.

FIG. 15 is a plan view showing internal structures of the chip part 1 shown in FIG. 1 and showing the forth embodiment example of a functional device 16. FIG. 16 is a cross sectional view taken along line XVI-XVI shown in FIG. 15 and showing the chip part being in a face-down posture. In this embodiment example, the same reference numerals are applied to the same structures as those described in the preferred embodiment, and the descriptions thereof will be omitted.

Referring to FIG. 15 and FIG. 16, the chip part 1 includes the diode D as the functional device 16. An example where the diode D is a bidirectional Zener diode is shown in FIG. 15 and FIG. 16.

The chip part 1 includes the substrate 2 that is a silicon substrate. The chip part 1 includes a first impurity region 82 of a p-type, and a plurality of second impurity regions 83A, 83B of an n-type. The first impurity region 82 is formed in a surficial portion of the first main surface 3 of the substrate 2. The plurality of second impurity regions 83A, 83B is formed in a surficial portion of the first impurity region 82.

The first impurity region 82 of the p-type, more specifically, is uniformly formed from the surficial portion of the first main surface 3 of the substrate 2 to a surficial portion of the second main surface 4 of the substrate 2. Therefore, a p-type conductivity is imparted to an entire region of the substrate 2.

The plurality of second impurity regions 83A, 83B is formed at a central portion in an opposing region where the first pad electrode film 14 and the second pad electrode film 15 are opposed to each other. The plurality of second impurity regions 83A, 83B is formed at intervals from each other along an orthogonal direction (i.e. the transverse direction of the substrate 2) that is orthogonal to an opposed direction where the first pad electrode film 14 and the second pad electrode film 15 are opposed to each other.

The plurality of second impurity regions 83A, 83B includes the second impurity regions 83A electrically connected to the first pad electrode film 14, and the second impurity regions 83B electrically connected to the second pad electrode film 15. The second impurity regions 83A and the second impurity regions 83B are alternately arranged along the orthogonal direction.

Each of the second impurity regions 83A, 83B is formed in a rectangular shape extending along the opposing direction in the planer view. The plurality of second impurity regions 83A, 83B is formed in substantially the same depth and substantially the same impurity concentration respectively.

The surface insulating film 13 covers the plurality of second impurity regions 83A, 83B. A plurality of first contact holes 84 and a plurality of second contact holes 85 are formed in the surface insulating film 13. The plurality of first contact holes 84 exposes the second impurity regions 83A respectively. The plurality of second contact holes 85 exposes the second impurity regions 83B respectively.

A plurality of first led-out electrode films 86 and a plurality of second led-out electrode films 87 are formed on the surface insulating film 13. The plurality of first led-out electrode films 86 and the plurality of second led-out electrode films 87 are formed in a comb shape that meshes with each other.

The plurality of first led-out electrode films 86 is electrically connected to the plurality of second impurity regions 83A in a one-to-one correspondence relationship. More specifically, each of the first led-out electrode films 86 is led out from the first pad electrode film 14 to the second pad electrode film 15 so as to cover the corresponding second impurity regions 83A in the one-to-one correspondence relationship. Each of the first led-out electrode films 86 is formed in a belt-shape in the planer view.

Each of the first led-out electrode films 86 enters the corresponding first contact holes 84 from above the surface insulating film 13. Each of the first led-out electrode film 86 is electrically connected to the second impurity regions 83A in the first contact holes 84.

The plurality of second led-out electrode films 87 is electrically connected to the plurality of second impurity regions 83B in a one-to-one correspondence relationship. More specifically, each of the second led-out electrode films 87 is led out from the second pad electrode film 15 to the first pad electrode film 14 so as to cover the corresponding second impurity regions 83A in the one-to-one correspondence relationship. Each of the second led-out electrode films 87 is formed in a belt-shape in the planer view.

Each of the second led-out electrode films 87 enters the corresponding second contact holes 85 from above the surface insulating film 13. Each of the second led-out electrode film 87 is electrically connected to the second impurity regions 83A in the second contact holes 85.

The diode D includes a pn junction formed in a region between the first impurity region 82 (the substrate 2) and the plurality of second impurity regions 83A, 83B. That is, the diode D includes a plurality of bidirectional Zener diode elements Del having the first impurity region 82 as an anode and the plurality of second impurity regions 83A, 83B as cathode.

The plurality of bidirectional Zener diode elements Del includes a first Zener diode DZ1 and a second Zener diode DZ2 formed adjacent to each other in the transverse direction of the substrate 2 respectively.

The first Zener diode DZ1 is formed by the pn junction between the first impurity region 82 (the substrate 2) and the second impurity regions 83A. The second Zener diode DZ2 is formed by the pn junction between the first impurity region 82 (the substrate 2) and the second impurity regions 83B. The first Zener diode DZ1 and the second Zener diode DZ2 are electrically connected via the first impurity region 82 (the substrate 2).

As described, the diode D is formed by one bidirectional Zener diode including the plurality of bidirectional Zener diode elements Del.

The functional device 16 (the diode D), the first pad electrode film 14 and the second pad electrode film 15 are formed through the following steps in the step of FIG. 8A and the step of FIG. 8B.

First, the base substrate 52 made of a p-type silicon wafer is prepared in the step of FIG. 8A.

Next, an n-type impurity is selectively implanted into the surficial portion of the first main surface 53 of the base substrate 52. The implantation of n-type impurities may be performed via an ion implantation mask. After the implantation of the n-type impurity, the ion implantation the mask is removed.

After implanting the n-type impurity, the n-type impurity is activated by a heat treatment. The plurality of second impurity regions 83A, 83B is thereby formed in the surficial portion of the first main surface 53 of the base substrate 52.

Next, the surface insulating film 13 is formed on the first main surface 53 of the base substrate 52. The surface insulating film 13 covers the plurality of second impurity regions 83A, 83B.

Next, a mask having a predetermined pattern is formed on the surface insulating film 13. The mask selectively has openings exposing regions where the plurality of first contact holes 84 and the plurality of second contact holes 85 are to be famed.

Next, unnecessary portions of the surface insulating film 13 are removed by an etching method via the mask. The plurality of first contact holes 84 and the plurality of second contact holes 85 are thereby formed.

Next, a base electrode film to be a basis of the first pad electrode film 14, the second pad electrode film 15, the plurality of first led-out electrode films 86 and the plurality of second led-out electrode films 87 is formed on the surface insulating film 13. The base electrode film may be formed by the sputtering method.

Next, a mask having the predetermined pattern is formed on the base electrode film. The mask covers regions to be the first pad electrode film 14, the second pad electrode film 15, the plurality of first led-out electrode films 86 and the plurality of second led-out electrode films 87.

Next, unnecessary portions of the base electrode film are removed by an etching method via the mask. The first pad electrode film 14, the second pad electrode film 15, the plurality of first led-out electrode films 86 and the second led-out electrode films are thereby formed on the surface insulating film 13. Thereafter, the steps of FIG. 8C to FIG. 8K are performed in this order. Through those steps, the chip part 1 having the diode D as the functional device 16 is manufactured.

As described above, the chip part 1 is a chip diode having the diode D as the functional device 16. The chip diode capable of contributing the smooth external appearance inspection can thus be provided.

The example where the diode D is the bidirectional Zener diode is described in FIG. 15 and FIG. 16. However, the diode D may be a Zener diode including only one of the first Zener diode DZ1 and the second Zener diode DZ2.

Although the specific structures of the functional device 16 have been described above by the first embodiment example to the fourth embodiment example, the functional device 16 can have a composite type structure where each structure of the first embodiment example to the third embodiment example is arbitrarily combined.

For example, a plurality of functional devices 16 are formed adjacent to each other along a direction parallel to the first main surface 3 of the substrate 2 in a region between the first pad electrode film 14 and the second pad electrode film 15. A plurality of functional devices 16 may be laminated along the normal direction of the first main surface 3 of the substrate 2 in the region between the first pad electrode film 14 and the second pad electrode film 15.

The plurality of functional devices 16 may include at least one of the resistance R, the capacitor C, the inductance L, and the diode D, respectively. The plurality of functional devices 16 may include the common functional device to each other or may include the different functional devices from each other.

Although the preferred embodiments of the present invention have been described above, the present invention may also be performed in yet other modes.

In the present preferred embodiment, the plurality of laser light irradiation regions 67 may be set to the second main surface 4 of the substrate 2 at intervals along the second direction (i.e. the transverse direction of the substrate 2). In this case, the plurality of laser light irradiation regions 67 may be set to the belt-shape extending along the first direction orthogonal to the second direction (i.e. the longitudinal direction of the substrate 2). The plurality of recesses 7 having the stripe pattern that is extending along the longitudinal direction of the substrate 2 and spaced along the transverse direction of the substrate 2 is formed.

In the present preferred embodiment, the plurality of laser light irradiation regions 67 may be set in a regular dot pattern or a discrete dot pattern with respect to the second main surface 4 of the substrate 2. The plurality of recesses 7 having a regular dot pattern or a discrete pattern with respect to the second main surface 4 of the substrate 2 is thereby formed.

In the present preferred embodiment, the etching method or the sand blasting method may be adopted instead of the laser light irradiation method.

In a case where the second main surface 4 of the substrate 2 is roughened by the etching method, the following process may be adopted. First, a mask having a predetermined pattern is formed on the second main surface 4 of the substrate 2. The mask selectively has a plurality of openings exposing a plurality of regions where the plurality of recesses 7 is to be formed.

Next, unnecessary portions of the second main surface 4 of the substrate 2 are removed. The second main surface 4 of the substrate 2 may be removed by an etching method via the mask. The mask is removed thereafter. The plurality of recesses 7 is thereby formed in the second main surface 4 of the substrate 2.

In a case where the second main surface 4 of the substrate 2 is roughened by the sand blasting method, the following process may be adopted. First, abrasives are sprayed on the second main surface 4 of the substrate 2. The abrasives may include known materials such as SiC, alumina, zircon or the like. The physical damages caused by the abrasives are given to the second main surface 4 of the substrate 2 in the sand blasting method. The plurality of recesses 7 is thereby formed in the second main surface 4 of the substrate 2.

In the present preferred embodiment, the step of forming the first external terminal 22 and the second external terminal 23 may be performed after the roughening step (see FIG. 8K) of the second main surface 4 of the substrate 2. In this case, the first external terminal 22 and the second external terminal 23 may be formed by a barrel plating method.

A barrel plating apparatus is adopted in the barrel plating method. The barrel plating apparatus includes a container called a barrel and having a plurality of through holes a plating tank storing a plating solution, a negative electrode (i.e. cathode electrode) formed in the barrel, and a positive electrode (i.e. an anode electrode) formed in the plating tank.

In the process of forming the first external terminal 22 and the second external terminal 23, first, a plurality of intermediates of the chip parts 1 before the first external terminal 22 and the second external terminal 23 are formed is accommodated in the barrel. Next, the barrel where the plurality of intermediates of the chip parts 1 is accommodated is immersed in the plating tank where the plating solution is stored.

Next, the negative electrode in the barrel and the positive electrode in the plating tank are energized while rotating the barrel in a state immersed in the plating solution. The first external terminal 22 is thereby formed on the first pad electrode film 14 exposed from the first pad opening 20. The second external terminal 23 is also formed on the second pad electrode film 15 exposed from the second pad opening 21.

Figure 17:
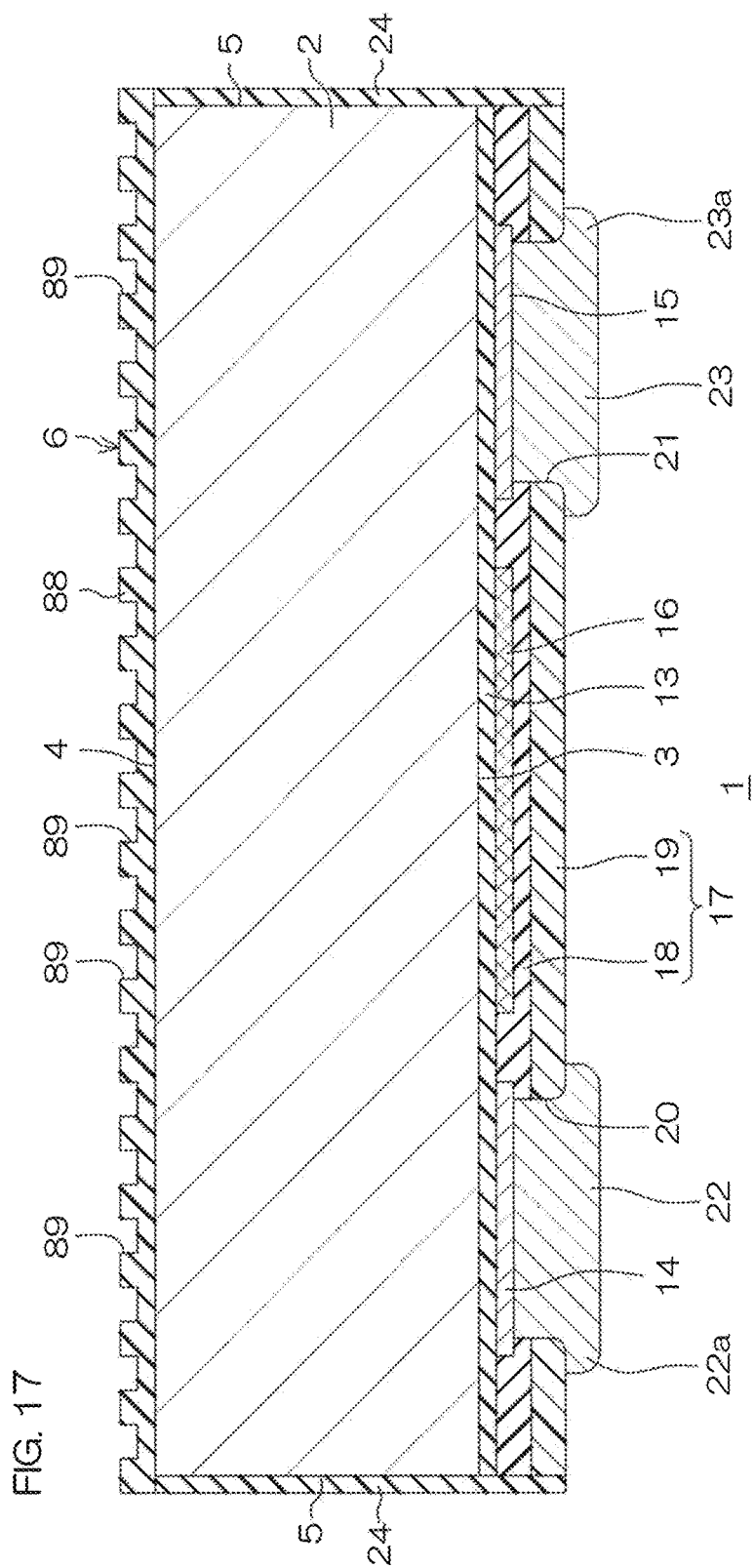
FIG. 17 is a cross sectional view showing a modified example of a light diffusion reflection structure.

In the present preferred embodiment, the light diffusion reflection structure 6 having a structure shown in FIG. 17 may be adopted. FIG. 17 is a cross sectional view showing a modified example of the light diffusion reflection structure 6. In FIG. 17, the same reference numerals are applied to the same structures as those described in the preferred embodiment, and the descriptions thereof will be omitted.

Referring to FIG. 17, an insulating film 88 is formed on the second main surface 4 of the substrate 2. The insulating film 88 covers substantially entire region of the second main surface 4 of the substrate 2. The insulating film 88 may include one or both of an oxide film (an $SiO_2$ film) and a nitride film (an SiN film). The insulating film 88 may be formed by a CVD method in the step of FIG. 8K.

A plurality of recesses 89 is formed in the insulating film 88. The plurality of recesses 89 are formed by selectively removing unnecessary portions of the insulating film 88 by an etching method via a mask after the formation of the insulating film 88 in the step of FIG. 8K.

In this modified example, the light diffusion reflection structure 6 is formed by the plurality of recesses 89 formed in the insulating film 88.

In this modified example, an example where the plurality of recesses 89 is formed in the insulating film 88 has been described. However, a fine uneven structure can be formed by adhering insulation particles (for example, $SiO_2$ particles or SiN particles) to the second main surface 4 of the substrate 2 by a CVD method. In this case, the light diffusion reflection structure 6 is formed by the fine uneven structure including insulating particles adhered on the second main surface 4 of the substrate 2.

In the present preferred embodiment, the substrate 2 may be a semiconductor substrate. The semiconductor the substrate may be a silicon substrate. In a case where the substrate 2 includes the semiconductor substrate, the insulating film 10 can be formed by a silicon oxide film.

In the present preferred embodiment, the substrate 2 may be an insulating substrate. The insulating substrate may include glass ($SiO_2$) or resin (e.g. epoxy resin). In a case where the substrate includes the insulating substrate, the surface insulating film 13 and the sidewall insulating layer 24 can be omitted.

The present application corresponds to Japanese Patent Application No. 2016-155914 filed in the Japan Patent Office on Aug. 8, 2016 and the entire disclosures of the applications are incorporated herein by reference.

Although the preferred embodiments of the present invention and have been described in detail as above, these are merely specific examples used to clarify the technical contents of the present invention, and the present invention should not be understood as being limited to these examples, and the scope of the present invention is to be determined solely by the appended claims.

What is claimed is:

1. A chip part comprising:
    a substrate having a first main surface on one side thereof and a second main surface on the other side thereof;
    a functional device formed at a first main surface side of the substrate;
    an external terminal formed at the first main surface side of the substrate and electrically connected to the functional device; and
    a light diffusion reflection structure formed at a second main surface side of the substrate and diffusely reflecting light irradiated toward the second main surface of the substrate,
    wherein the light diffusion reflection structure is formed by an uneven structure formed at the second main surface side of the substrate, and
    the chip part further comprises an insulating film covering the second main surface of the substrate.

2. The chip part according to claim 1, wherein the light diffusion reflection structure is formed by a roughened surface formed at the second main surface side of the substrate.

3. The chip part according to claim 1, wherein the uneven structure includes a plurality of recesses formed at the second main surface of the substrate, and
    the insulating film includes a first portion covering an inner wall of each recess, and a second portion covering an outside region of each recess and having a thickness larger than a thickness of the first portion.

4. The chip part according to claim 1 further comprising:
    an electrode film formed at the first main surface side of the substrate and electrically connected to the functional device; and
    an insulating layer formed at the first main surface side of the substrate so as to cover the functional device and having a pad opening exposing the electrode film; wherein
    the external terminal is formed in the pad opening.

5. The chip part according to claim 1, wherein the functional device includes at least one of a resistor, a capacitor, a coil or a diode.

6. A circuit module comprising:
    a mounting substrate having a main surface at which a wiring is formed; and
    the chip part according to claim 1 arranged at the main surface of the mounting substrate in a posture where the first main surface of the substrate faces the main surface of the mounting substrate.

* * * * *